(12) United States Patent
Liu

(10) Patent No.: US 8,537,592 B2
(45) Date of Patent: Sep. 17, 2013

(54) ARRAYS OF NONVOLATILE MEMORY CELLS AND METHODS OF FORMING ARRAYS OF NONVOLATILE MEMORY CELLS

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 147 days.

(21) Appl. No.: 13/088,238

(22) Filed: Apr. 15, 2011

(65) Prior Publication Data

US 2012/0262973 A1    Oct. 18, 2012

(51) Int. Cl.
*G11C 11/00* (2006.01)

(52) U.S. Cl.
USPC ............... 365/148; 365/51; 365/63

(58) Field of Classification Search
USPC ............ 365/148, 51, 63, 163; 257/4–5, 257/E21.645, E21.004; 438/128, 382
See application file for complete search history.

(56) References Cited

U.S. PATENT DOCUMENTS

| | | |
|---|---|---|
| 4,715,685 A | 12/1987 | Yaniv et al. |
| 4,964,080 A | 10/1990 | Tzeng |
| 5,049,970 A | 9/1991 | Tanaka et al. |
| 5,122,476 A | 6/1992 | Fazan et al. |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner |
| 6,905,937 B2 | 6/2005 | Hsu et al. |

(Continued)

FOREIGN PATENT DOCUMENTS

| | | |
|---|---|---|
| CN | 1444284 | 9/2003 |
| CN | 1459792 | 12/2003 |

(Continued)

OTHER PUBLICATIONS

U.S. Appl. No. 12/701,885, filed Feb. 8, 2010, Sandhu et al.

(Continued)

*Primary Examiner* — David Lam
(74) *Attorney, Agent, or Firm* — Wells St. John, P.S.

(57) ABSTRACT

An array of nonvolatile memory cells includes a plurality of vertically stacked tiers of nonvolatile memory cells. The tiers individually include a first plurality of horizontally oriented first electrode lines and a second plurality of horizontally oriented second electrode lines crossing relative to the first electrode lines. Individual of the memory cells include a crossing one of the first electrode lines and one of the second electrode lines and material there-between. Specifically, programmable material, a select device in series with the programmable material, and current conductive material in series between and with the programmable material and the select device are provided in series with such crossing ones of the first and second electrode lines. The material and devices may be oriented for predominant current flow in defined horizontal and vertical directions. Method and other implementations and aspects are disclosed.

22 Claims, 24 Drawing Sheets

(56) References Cited

U.S. PATENT DOCUMENTS

| | | |
|---|---|---|
| 6,930,324 B2 | 8/2005 | Kowalski et al. |
| 6,940,113 B2 | 9/2005 | Hsu et al. |
| 6,946,702 B2 | 9/2005 | Jang |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,679,812 B2 | 3/2010 | Sasagawa et al. |
| 7,687,793 B2 | 3/2010 | Harshfield et al. |
| 7,696,077 B2 | 4/2010 | Liu |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,910,909 B2 | 3/2011 | Kim et al. |
| 8,021,897 B2 | 9/2011 | Sills et al. |
| 8,094,477 B2 * | 1/2012 | Maejima .................. 365/51 |
| 2002/0018355 A1 | 2/2002 | Johnson et al. |
| 2002/0196695 A1 | 12/2002 | Pascucci |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0207218 A1 | 9/2005 | Lung et al. |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0258079 A1 | 11/2006 | Lung et al. |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0045615 A1 | 3/2007 | Cho et al. |
| 2007/0048990 A1 | 3/2007 | Zhuang et al. |
| 2007/0109835 A1 | 5/2007 | Hsu |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0268739 A1 | 11/2007 | Yoo et al. |
| 2007/0268742 A1 | 11/2007 | Liu |
| 2007/0285965 A1 | 12/2007 | Toda et al. |
| 2007/0295950 A1 | 12/2007 | Cho et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0080229 A1 | 4/2008 | Choi et al. |
| 2008/0102278 A1 | 5/2008 | Kreupl et al. |
| 2008/0157257 A1 | 7/2008 | Bertin et al. |
| 2008/0175031 A1 | 7/2008 | Park et al. |
| 2008/0185571 A1 | 8/2008 | Happ et al. |
| 2008/0232160 A1 | 9/2008 | Gopalakrishnan |
| 2008/0247219 A1 | 10/2008 | Choi et al. |
| 2008/0258126 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0072217 A1 | 3/2009 | Klostermann |
| 2009/0085121 A1 | 4/2009 | Park et al. |
| 2009/0180309 A1 | 7/2009 | Liu |
| 2009/0250681 A1 | 10/2009 | Smythe et al. |
| 2009/0261314 A1 | 10/2009 | Kim et al. |
| 2009/0267047 A1 | 10/2009 | Sasago et al. |
| 2009/0268532 A1 | 10/2009 | DeAmbroggi et al. |
| 2009/0272960 A1 | 11/2009 | Srinivasan et al. |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0317540 A1 | 12/2009 | Sandhu et al. |
| 2010/0003782 A1 | 1/2010 | Sinha et al. |
| 2010/0008163 A1 | 1/2010 | Liu |
| 2010/0065836 A1 | 3/2010 | Lee |
| 2010/0084741 A1 | 4/2010 | Andres et al. |
| 2010/0110759 A1 | 5/2010 | Jin et al. |

| | | | |
|---|---|---|---|
| 2010/0135061 | A1 | 6/2010 | Li et al. |
| 2010/0140578 | A1 | 6/2010 | Tian et al. |
| 2010/0163820 | A1 | 7/2010 | Son |
| 2010/0163829 | A1 | 7/2010 | Wang et al. |
| 2010/0178729 | A1 | 7/2010 | Yoon et al. |
| 2010/0193758 | A1 | 8/2010 | Tian et al. |
| 2010/0193761 | A1 | 8/2010 | Amin et al. |
| 2010/0193762 | A1 | 8/2010 | Hsieh et al. |
| 2010/0232200 | A1 | 9/2010 | Shepard |
| 2010/0237442 | A1 | 9/2010 | Li et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 200880124714.6 | 7/2012 |
| EP | 1796103 | 9/2006 |
| JP | 2005175457 | 6/2005 |
| JP | 2006032729 | 2/2006 |
| JP | 2006040981 | 2/2006 |
| JP | 2006074028 | 3/2006 |
| JP | 2006121044 | 5/2006 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100083402 | 7/2010 |
| WO | WO 2006/003620 | 1/2006 |
| WO | PCT/US08/084422 | 3/2009 |
| WO | WO 2009/127187 | 10/2009 |
| WO | WO 2010/068221 | 6/2010 |
| WO | PCT/US08/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | PCT/US2011/051785 | 4/2012 |
| WO | PCT/US2011/066770 | 9/2012 |
| WO | PCT/US2011/051785 | 4/2013 |

OTHER PUBLICATIONS

U.S. Appl. No. 12/765,598, filed Apr. 22, 2010, Sandhu et al.
U.S. Appl. No. 12/765,606, filed Apr. 22, 2010, Tang et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
Baek et al., "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al.; "Peroskite RRAM Devices with Metal/Insulator/PCMO/Metal Heterostructures", 2005; pp. 125-128.
Choi et al., "Defect Structure and Electrical Properties of single-Crystal Ba0.03SR0.97TiO3", J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al., "Effects of Gas Phase Absorption into Si Substrates on Plasma doping Process".
Ho et al., "A Highly Reliable Self-Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology".
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory—RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stackable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Koojl et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.
Kozicki et al., "Non-Volatile Memory Based on Solid Electrolytes", Center for Solid State Electronics Research, Arizona State University, 8 pages.
Kozicki, "Memory Devices Based on Solid Electrolytes", Mater. Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEE, 2007, pp. 771-774.
Lee et al., "Resistance Switching of Al doped ZnO for Non-Volatile Memory Applications", Dept. of Materials Science and Engineering, Gwangju Institute of Science and Technology, 2 pages.
Lin et al., "Effect of Top Electrode Material on REsistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225. Abstract Only.
Scheck et al., "Selective Metal Electrodeposition Through Doping Modulation of Semiconductor Surfaces". Applied Physics Letters 86, 2005, 3 pgs.
Website, http://en.wikipedia.org/wiki/Programmable_metallization_cell, 4 pages.
Wuttig, "Towards a Universal Memory?", Nature Materials, vol. 4, Apr. 2005, pp. 265-266.
Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Allpied Physics 97, 2005, 4 pgs.
Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.
Yoon et al., "Vertical Cross-Point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications", IEEE, 2008, pp. 331-333.

* cited by examiner

ARRAYS OF NONVOLATILE MEMORY CELLS AND METHODS OF FORMING ARRAYS OF NONVOLATILE MEMORY CELLS

TECHNICAL FIELD

Embodiments disclosed herein pertain to nonvolatile memory cells, to arrays of nonvolatile memory cells, and to methods of forming arrays of nonvolatile memory cells

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers therein to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between a first memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Figure 1:
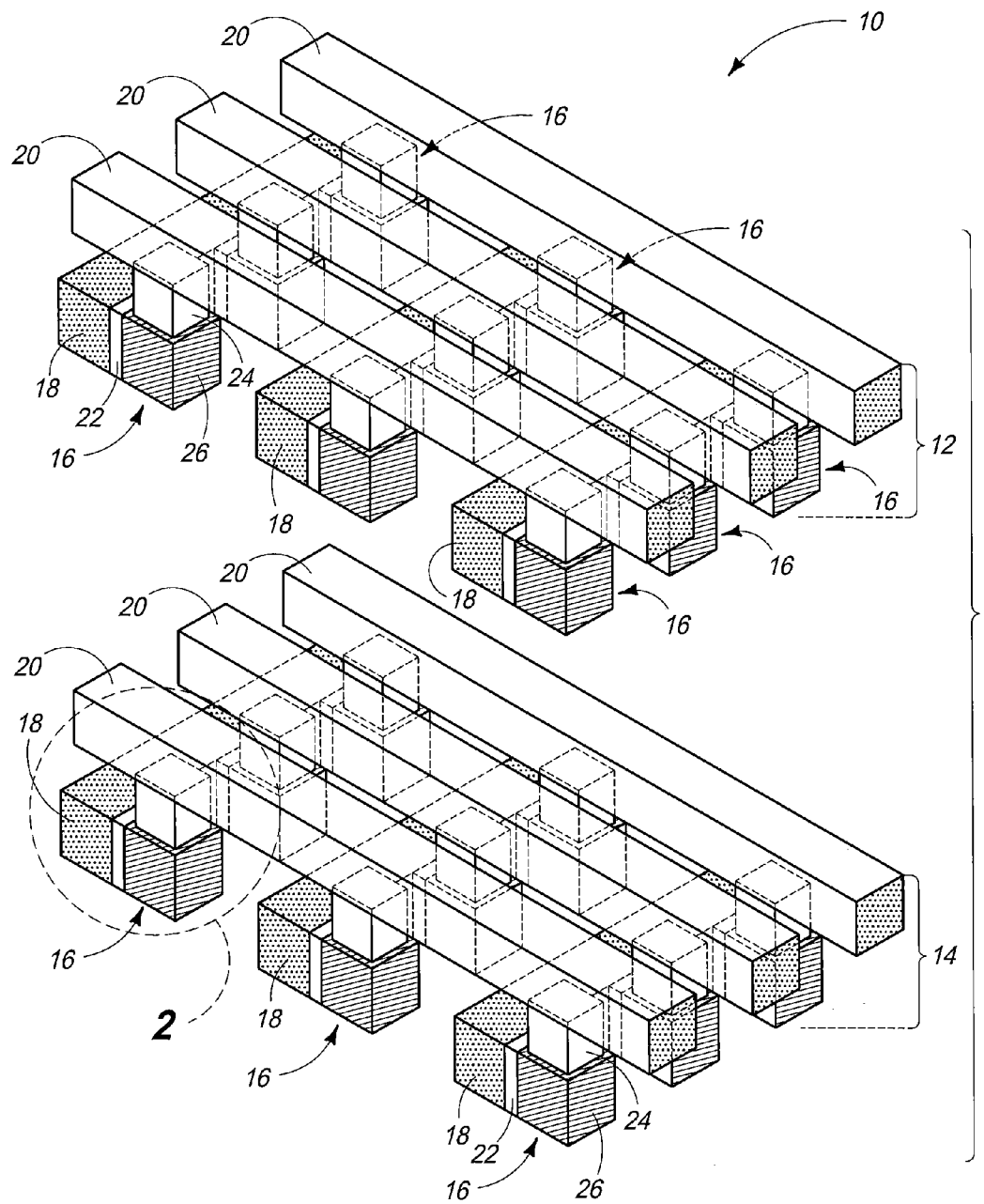
FIG. 1 is a diagrammatic, exploded, isometric view of a portion of an array of nonvolatile memory cells in accordance with an embodiment of the invention.

Embodiments of the invention include arrays of nonvolatile memory cells, methods of forming a horizontal array of nonvolatile memory cells, and methods of forming an array of vertically stacked tiers of nonvolatile memory cells. Some example embodiments are initially described with reference to FIGS. 1-3 of an array 10 of vertically stacked tiers of memory cells. FIG. 1 shows a portion of an array area within which a plurality of nonvolatile memory cells 16 has been fabricated. Logic circuitry (not shown) may be fabricated outside of the array area. Control and/or other peripheral circuitry (not shown) for operating the memory array may or may not fully or partially within the array area, with an example array area as a minimum encompassing all of the memory cells of a given array/sub-array. Further, multiple sub-arrays might also be fabricated and operated independently, in tandem, or otherwise relative one another. As used in this document, a "sub-array" may also be considered as an array.

FIG. 1 depicts two vertically stacked tiers 12, 14 of individual memory cells 16. One or more tiers may be elevationally outward of tier 12 and/or elevationally inward of tier 14.

Regardless, array 10 would be fabricated relative to a suitable base substrate (not shown) which may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material elevationally inward of the dielectric material. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, "elevational" and "elevationally" are with reference to the vertical direction from a base substrate upon which the circuitry is fabricated. The base substrate may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

FIG. 1 is exploded in the vertical direction for clarity. Tiers 12 and 14 may be much more vertically closer one another than depicted, and separated by a suitable dielectric (not shown). Further, array 10 would likely be encompassed within/encapsulated by dielectric which is not shown in any of the figures for clarity of operative memory cell components within the array.

Vertical tiers 12, 14 may be of the same or different respective construction(s). In one embodiment, all of such are of the same construction, for example perhaps to achieve an ultimate highest density and/or for ease in fabrication. Regardless, at least some of the individual vertical tiers may be characterized by certain attributes example embodiments of which are described with reference to FIGS. 1-3 with respect to an example individual memory cell 16. Array 10 comprises a first plurality of horizontally oriented first electrode lines 18 and a second plurality of horizontally oriented second electrode lines 20 within respective of individual tiers 12 and 14. Second electrode lines 20 cross relative to first electrode lines 18, and in the example embodiment are elevationally outward of first electrode lines 18. Alternately, such may be elevationally inward of first electrode lines 18. Electrode lines 18 and 20 comprise current conductive material, and may be homogenous or non-homogenous. In the context of this document, "current conductive material" is a composition where electric current flow would inherently occur therein predominantly by movement of subatomic positive and/or negative charges when such are generated as opposed to predominantly by movement of ions. Example current conductive materials are elemental metals, alloys of elemental metals, current conductive metal compounds, and conductively doped semiconductive material, including any combinations thereof.

Individual memory cells 16 comprise a crossing one of a horizontal first electrode line 18 and a horizontal second electrode line 20. Such also comprise programmable material 22 and a select device 24. Material 22 and device 24 are both between electrodes 18 and 20 in electrical series connection with electrode lines 18 and 20. Memory cells 16 also include current conductive material 26. Material 26 is both between material 22 and select device 24, and in electrical series connection with material 22 and select device 24. Current conductive material 26 may form part of the select device. Regardless, the depicted positions of programmable material 22 and select device 24 may be reversed. Any select device may be used, with transistors and diodes being but two examples. Regardless, each of components 22 and 24 may be homogenous or non-homogenous, and may be of the same or different shape(s), thickness(es), other dimensions, etc. relative one another. Current conductive material 26 also may be homogenous or non-homogenous. Example materials include any of those described above with respect to first electrode lines 18 and second electrode lines 20. Any two or three of conductive material of components 18, 20 and 26 may be of the same composition or of different compositions.

The programmable material may be solid, gel, amorphous, crystalline, or any other suitable phase. Any programmable material may be used, with some examples being provided below. The programmable material may be isolated relative to each memory cell as shown, or alternately might be continuous along some plurality of memory cells. For example, a programmable material 22 or 24 may extend continuously (not shown) along first electrode line 18 or second electrode line 20, respectively.

Figure 2:
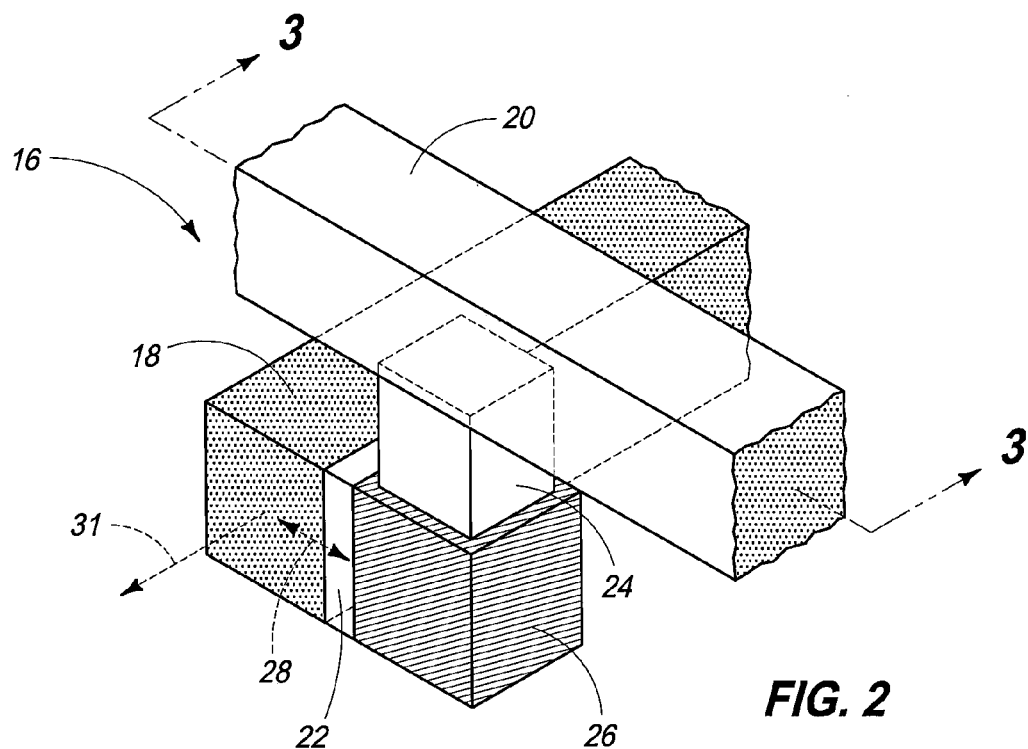
FIG. 2 is an enlarged view of a portion of FIG. 1.
Figure 3:
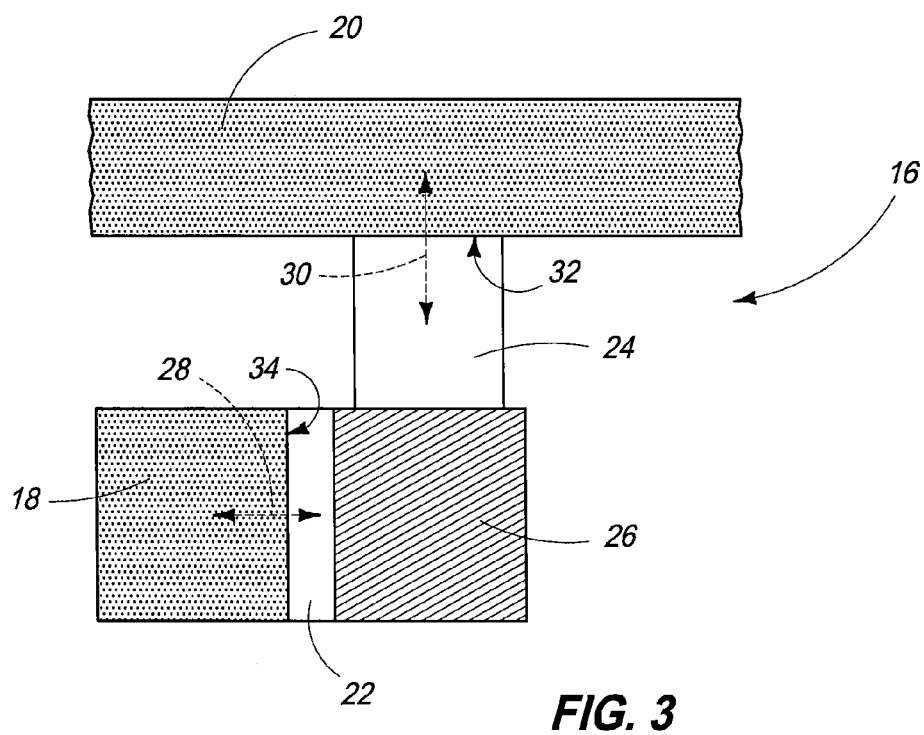
FIG. 3 is a sectional view of FIG. 2 taken through line 3-3 in FIG. 2.

FIGS. 1-3 depict an example embodiment wherein immediately adjacent of components 20, 24, 26, 22 and 18 are directly against one another. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another. Other structures than those depicted in FIGS. 1-3 are contemplated with respect to whether materials or structures are directly against one another. For example, material in a memory cell may be provided between any pair of components 20 and 24, components 24 and 26, components 26 and 22, and components 22 and 18.

In one embodiment, the components are constructed and arranged such that predominant current flow into or out of the crossing one of first electrode line 18 out of or into component 22 (one of programmable material or a select device) is in a horizontal direction 28 (FIGS. 2 and 3). In one embodiment, the components are constructed and arranged such that predominant current flow into or out of the crossing one of second electrode line 20 out of or into component 24 (one of programmable material or a select device) is in a vertical direction 30 (FIG. 3). In one embodiment, the select device is oriented for predominant current flow relative to the respective second electrode line in the vertical direction and the programmable material is oriented for predominant current flow relative to the first electrode line in the horizontal direction. In one embodiment, the programmable material is oriented for predominant current flow relative to the second electrode line in the vertical direction and the select device is oriented for predominant current flow relative to the first electrode line in the horizontal direction. In one embodiment, the crossing first electrode line may be considered as extending along a first axis 31 (FIG. 2), with horizontal direction 28 being perpendicular to first axis 31. Further, lines 18 and 20 in the depicted embodiment are shown as being straight linear. Alternately as an example, such may be curvilinear.

FIG. 3 depicts an example embodiment wherein electrode lines 20 and 18 have respective first and second planar surfaces 32 and 34 directly against which component/material 24 and 22, respectively, is received. Further in such example, such planar surfaces constitute all surface area against which material/components 24 and 22 are against their respective crossing electrode line. Alternately as an example, interface between the electrode lines and material/components 24 and/or 22 may be with respect to entirely non-planar surfaces, a combination of planar and non-planar surfaces, or a combination of multiple stepped planar surfaces.

Figure 4:
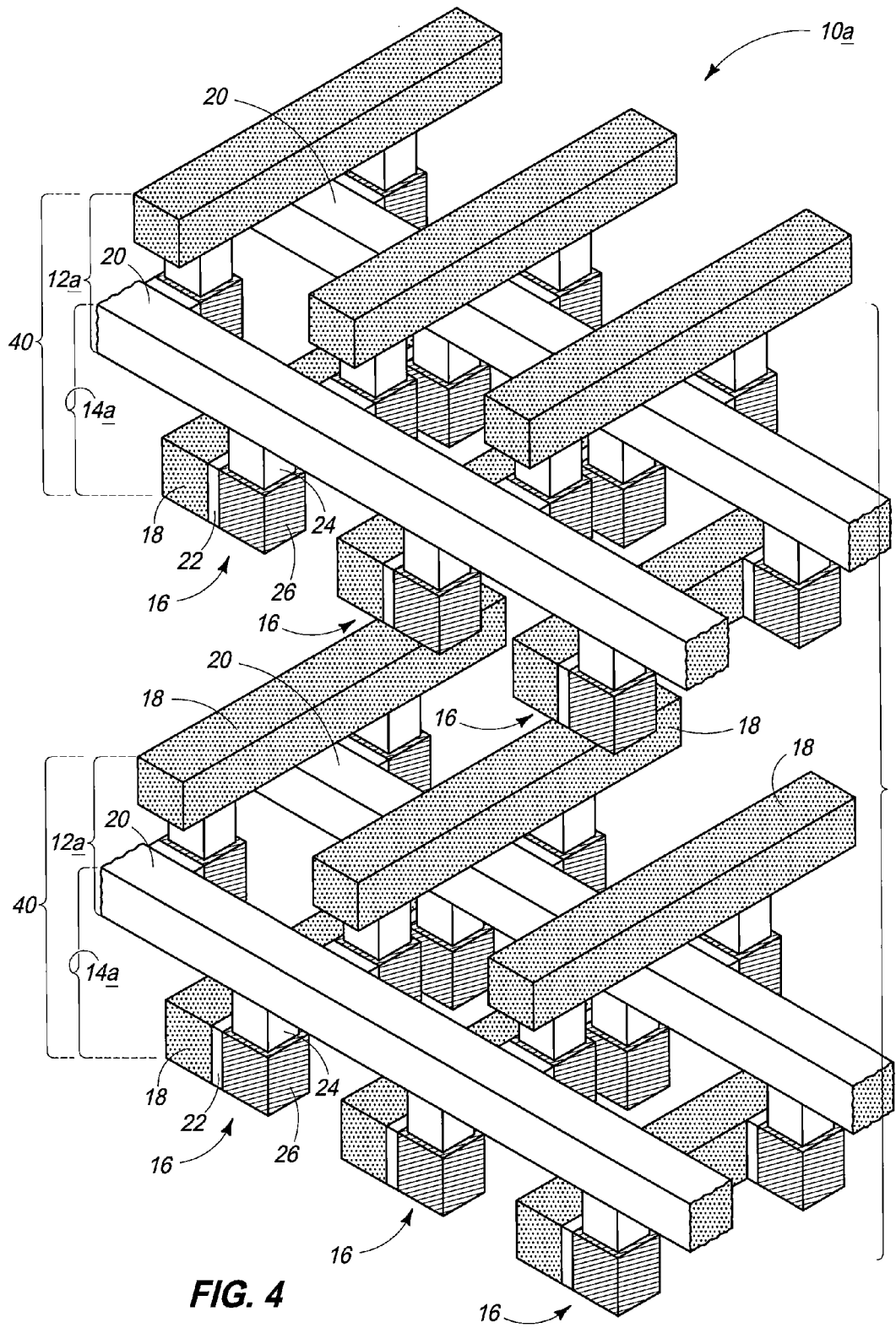
FIG. 4 is a diagrammatic, exploded, isometric view of a portion of an array of nonvolatile memory cells in accordance with an embodiment of the invention.

An alternate embodiment array 10a of vertically stacked tiers of nonvolatile memory cells is shown in FIG. 4. Like numerals from the above-described embodiments have been used where appropriate, with some construction differences being indicated with the suffix "a" or with different numerals. Array 10a comprises a plurality of vertically stacked tiers comprising multiple pairs 40 of two immediately adjacent tiers 12a, 14a. The two immediately adjacent tiers 12a, 14a of the respective pairs 40 share one of the first or second pluralities of horizontally oriented electrode lines. FIG. 4 depicts an example embodiment wherein second electrode lines 20 are shared. Alternately, the shared plurality of lines may be the first electrode lines (not shown). Regardless, FIG. 4 depicts two pairs 40 of immediately adjacent tiers 12a, 14a. Additional pairs, and/or other circuitry, may be elevationally inward and/or elevationally outward of the depicted two pairs 40.

One of the two immediately adjacent tiers of the respective pairs is an elevationally outer tier (i.e., tier 12a) and another of the two immediately adjacent tiers of the respective pairs is an elevationally inner tier (i.e., tier 14a). In one embodiment and as shown, predominant current flow within outer tier 12a into or out of component 22 (either programmable material or a select device) out of or into, respectively, individual of shared electrode lines 20 is in the horizontal direction. In one embodiment and as shown, predominant current flow within inner tier 14a into or out of component 24 (the other of programmable material or a select device) out of or into, respectively, a shared electrode line 20 is in the vertical direction. Alternate orientations may be used.

By way of example, FIG. 4 depicts an embodiment wherein multiple pairs of two immediately adjacent tiers share one of the first plurality of horizontally oriented first electrode lines or the second plurality of horizontally oriented second electrode lines. FIG. 1 depicts an alternate embodiment wherein no immediately adjacent tiers share any electrode lines of the first and second plurality of horizontally oriented electrode lines.

An embodiment of the invention encompasses an array of vertically stacked tiers of nonvolatile memory cells comprising multiple tiers of two immediately adjacent tiers. The two immediately adjacent tiers of the respective pairs comprise a shared plurality of horizontally oriented electrode lines. An elevationally outer of two immediately adjacent tiers of the respective pairs comprises an elevationally outer plurality of horizontally oriented electrode lines. An elevationally inner of the two immediately adjacent tiers of the respective pairs comprises an elevationally inner plurality of horizontally oriented electrode lines. Individual of the memory cells comprise programmable material and a select device operatively between a crossing one of the shared horizontally oriented electrode lines and one of the outer or inner horizontally oriented electrode lines. FIG. 4 depicts, by way of example, such an embodiment. Yet an embodiment as just-described doesn't necessarily require that individual memory cells be oriented for predominant current flow into or out of the respective programmable material and select device in a combination of horizontal and vertical directions. Further while FIG. 4 depicts two pairs of immediately adjacent tiers, more than two pairs tiers may be included in the array of vertically stacked tiers.

Figure 5:
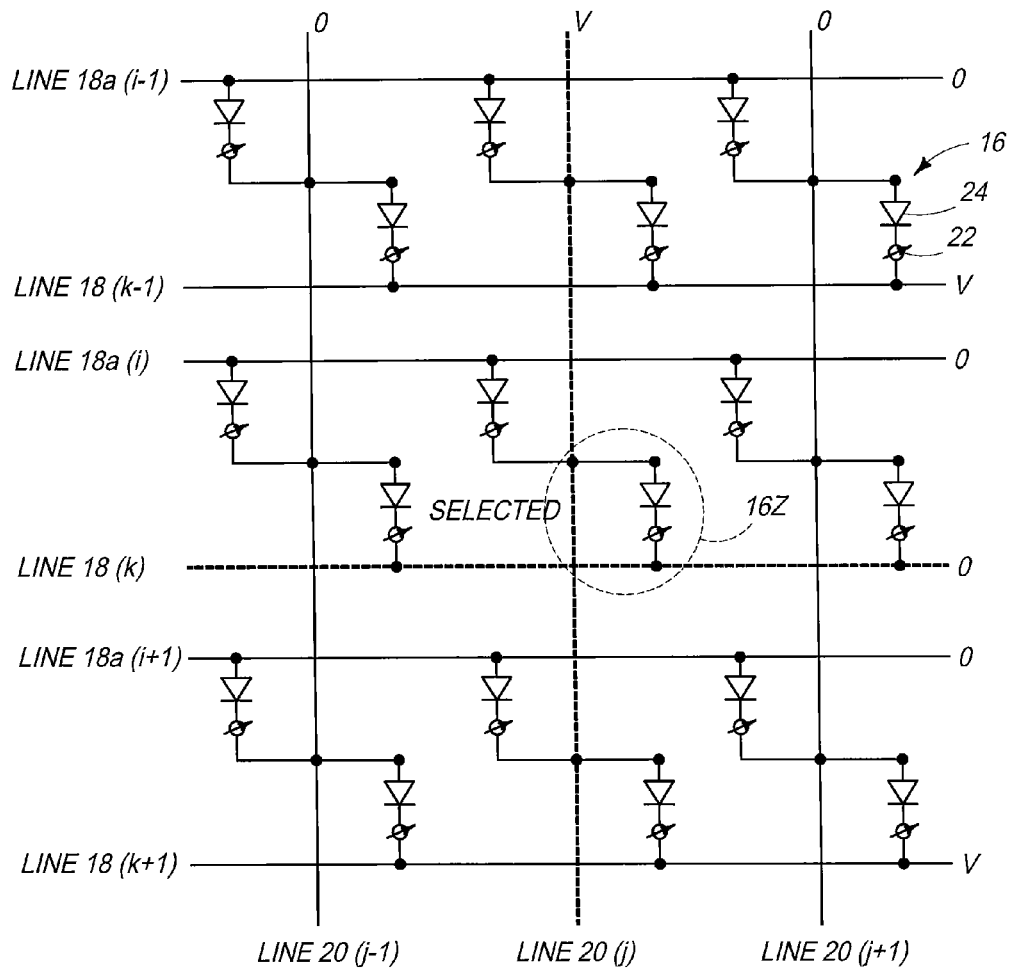
FIG. 5 is a circuit schematic of a portion of a FIG. 4-*like* array.

FIG. 5 depicts an example circuit schematic representative of a FIG. 4-*like* construction wherein three pairs of two immediately adjacent tiers are shown. By way of example only, such depicts individual memory cells 16 as comprising a crossing one of shared electrode lines 20 and one of crossing electrode lines 18 or 18a. Such further, by way of example only, are depicted as comprising programmable material 22 and a select device 24 in the form of a diode. The following example biasing scheme may be employed for selecting the depicted memory cell 16Z and no other of the depicted or non-depicted memory cells 16. If the selected memory cell 16Z associated with the intersection of line 18(k) and line 20(j) is biased at voltage V on line 20(j) and at 0V on line 18(k), thus turning "on" diode 24 of memory cell 16Z, memory cell 16Z is accessed. Remaining lines 18(i) may be biased at ground (0V). All other lines 20(j) may also be biased at ground, and all other lines 18 biased at V. All unselected diodes 24 of the other memory cells 16 are thereby "off" the result of such biasing. All other lines (not shown) elevationally outward of lines 18a may be biased at ground, while all other lines (not shown) below lines 18 may be biased at V.

Figure 6:
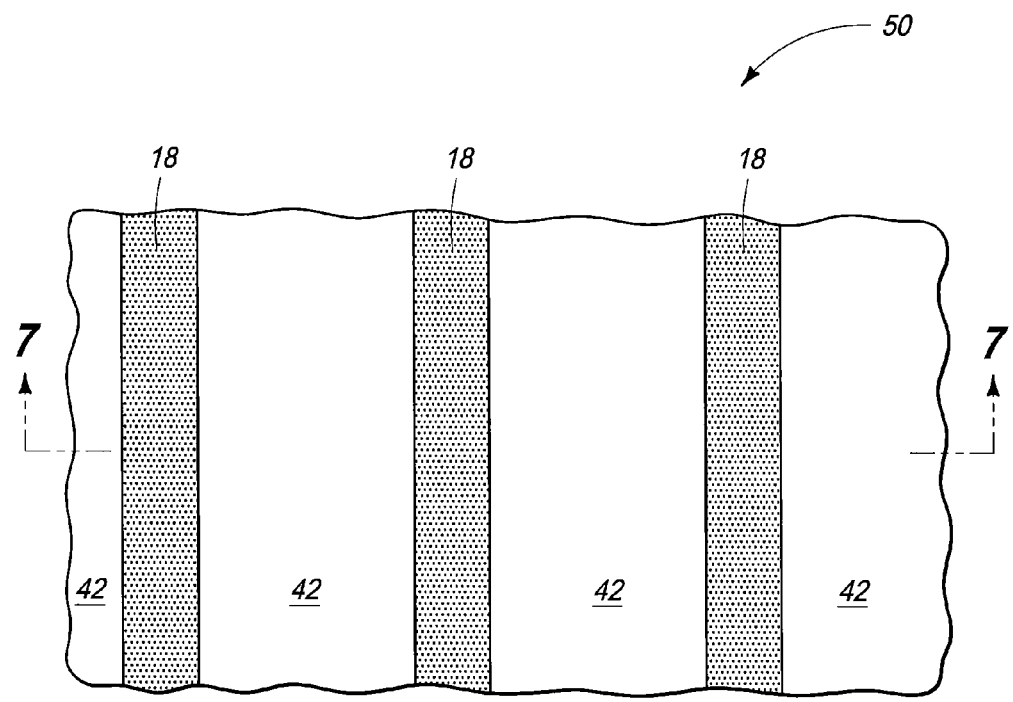
FIGS. 6-19 are diagrammatic top views and sectional views of a substrate fragment in process in ultimately producing an array of nonvolatile memory cells in accordance with an embodiment of the invention.
Figure 7:
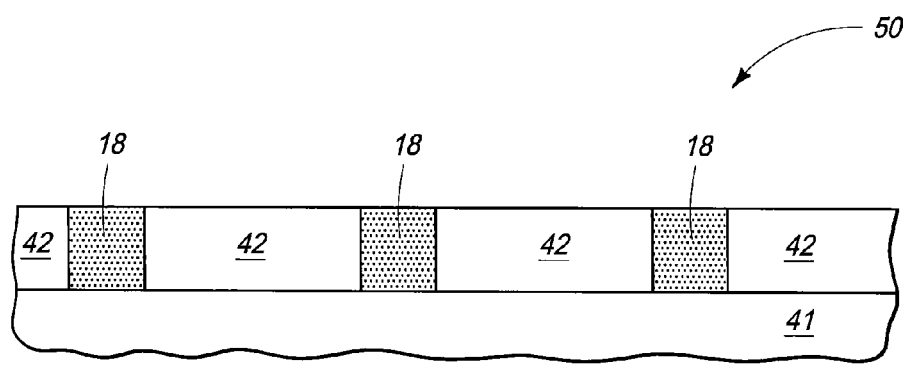

Any of the above constructions may be fabricated in accordance with any existing or yet-to-be-developed technique(s). An example of fabricating array 10 of FIG. 3 is next described with reference to FIGS. 6-19. An embodiment of the invention includes a method of forming a horizontal array of nonvolatile memory cells, for example any one or combination of the horizontal arrays of individual of tiers 12 and 14 of FIG. 3. Referring to FIGS. 6 and 7, a substrate fragment in process is indicated generally with reference numeral 50, for example in fabricating an individual tier 14 of the FIG. 1 or other array. Like numerals from FIGS. 1-3 have been used where appropriate, with some construction differences being indicated with the suffix "b" or with different numerals. Further, numerals 18, 22, 26, 24 and 20 are used to designate the materials from which such components are fabricated prior to necessarily being of the final example shapes for clarity in the drawings and ease of understanding in the description. Substrate 50 comprises a suitable base substrate 41 (FIG. 7) over which a plurality of first horizontally oriented electrode lines 18 has been formed. Dielectric material 42 is between electrode lines 18. Such may be homogenous or non-homogenous, with silicon nitride, doped silicon dioxide, and/or undoped silicon dioxide being examples.

Figure 8:
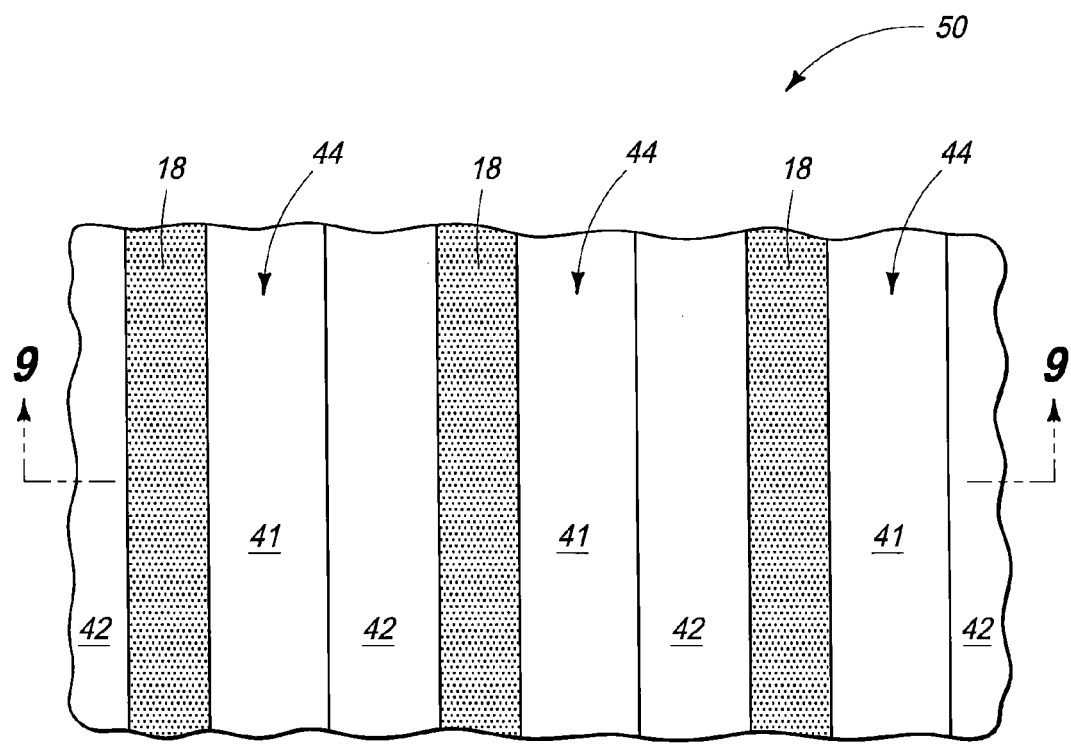
Figure 9:
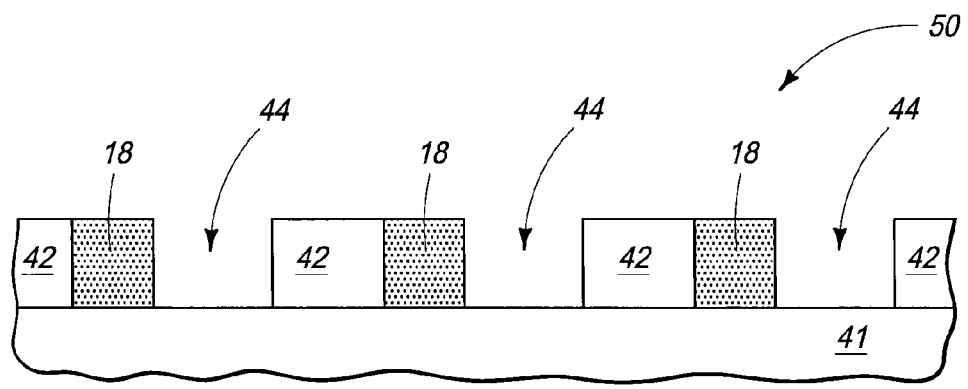

Referring to FIGS. 8 and 9, a plurality of horizontally elongated trenches 44 have been formed within dielectric material 42 along only one lateral side of the respective first electrode lines 18. An example technique for forming trenches 44 includes subtractive patterning and etch of dielectric material 42, for example selectively relative to the material of electrode lines 18 whereby trenches 44 self-align with respect to the depicted example one right lateral side of each electrode line 18.

Figure 10:
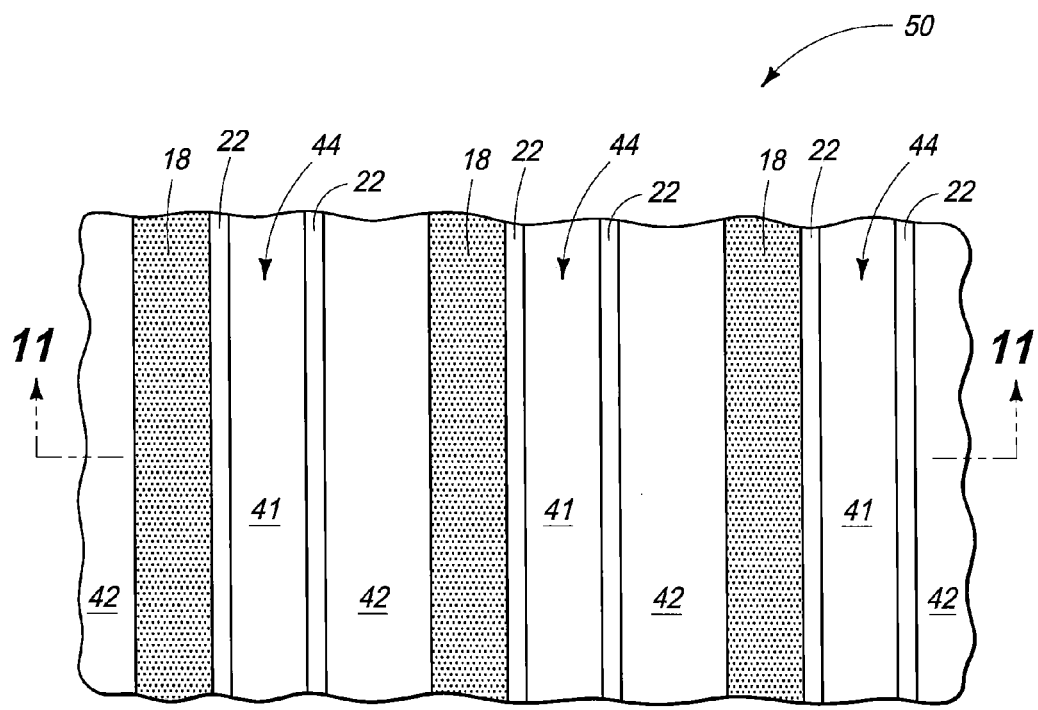
Figure 11:
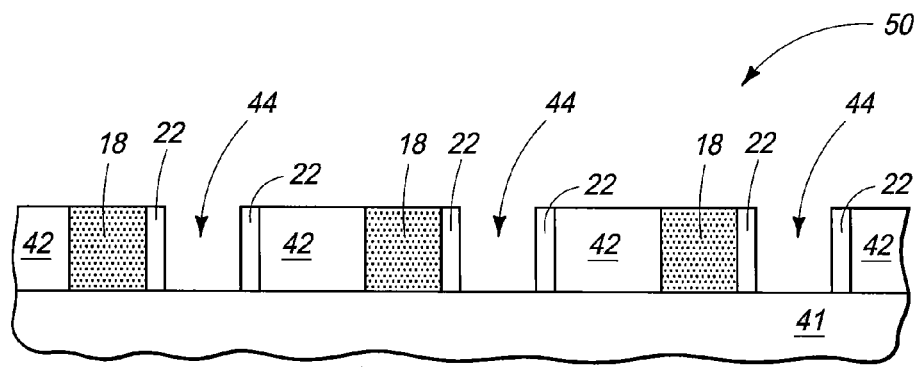

Referring to FIGS. 10 and 11, trenches 44 have been lined with one of select device material 22 or programmable material 22 that is in current conductive connection with the one lateral side of first electrode lines 18 along which trenches 44 were formed. FIGS. 10 and 11 depict but one example resulting construction, and which may be formed by depositing the depicted material 22 followed by planarizing and/or anisotropic etching thereof to remove such from being over the depicted horizontal surfaces.

Figure 12:
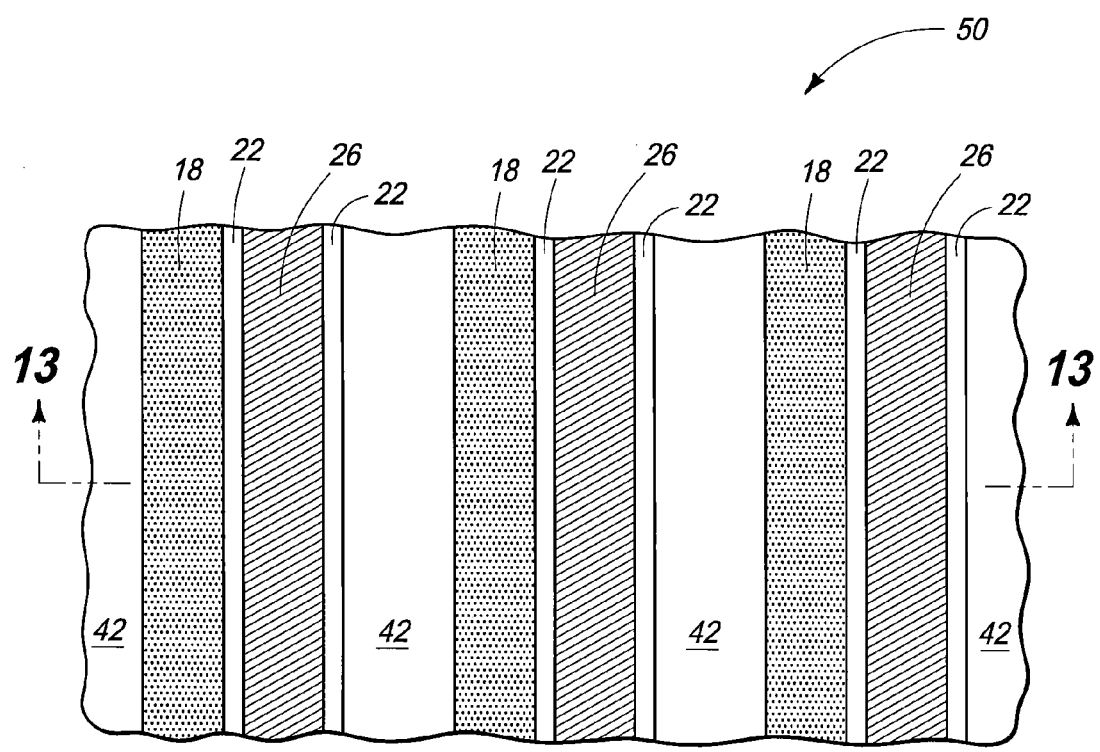
Figure 13:
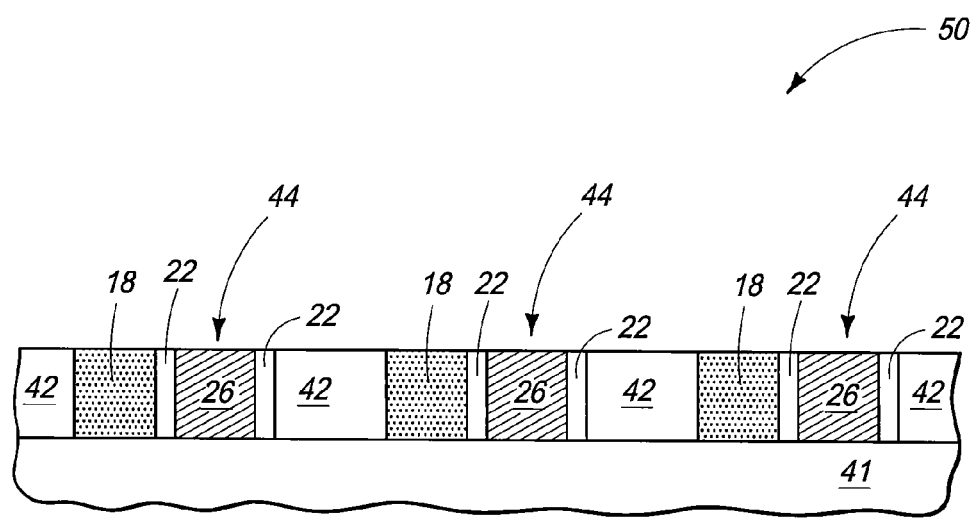

Referring to FIGS. 12 and 13, current conductive material 26 has been formed within trenches 44 laterally adjacent to and in current conductive connection with the one of select device material 22 or programmable material 22. An example technique includes deposition of material 26 followed by planarizing such back to the elevationally outermost surfaces of electrode lines 18, material 22, and dielectric material 42.

Figure 14:
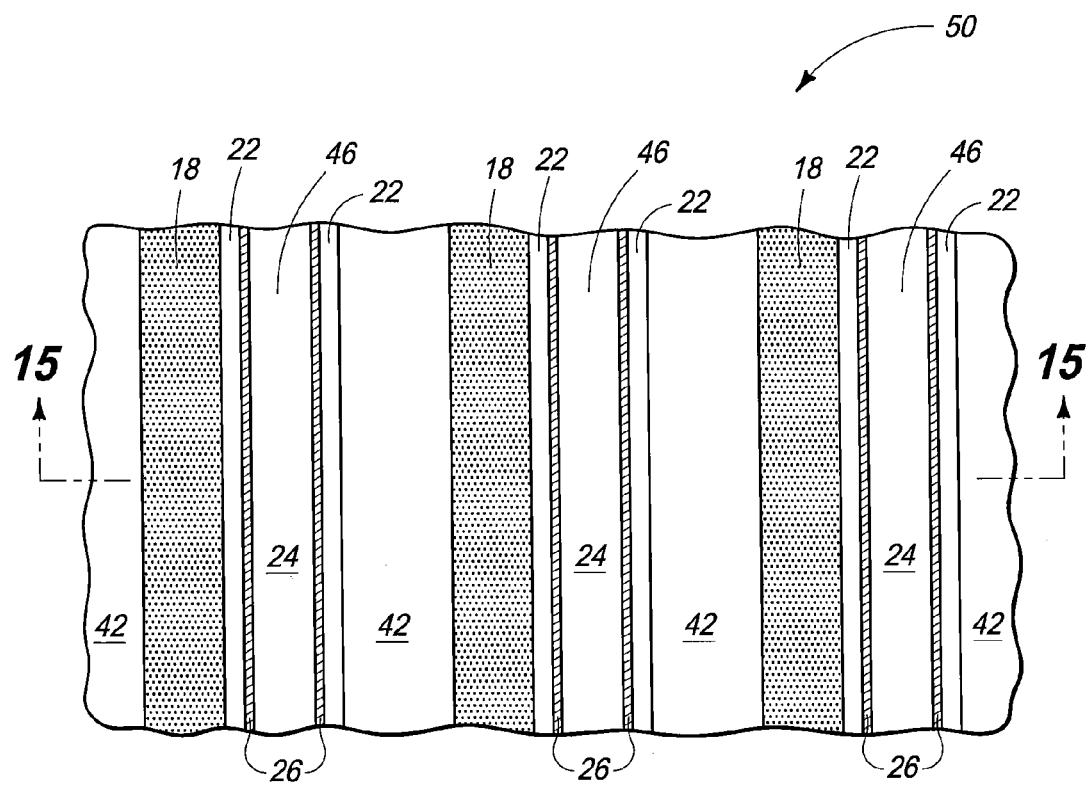
Figure 15:
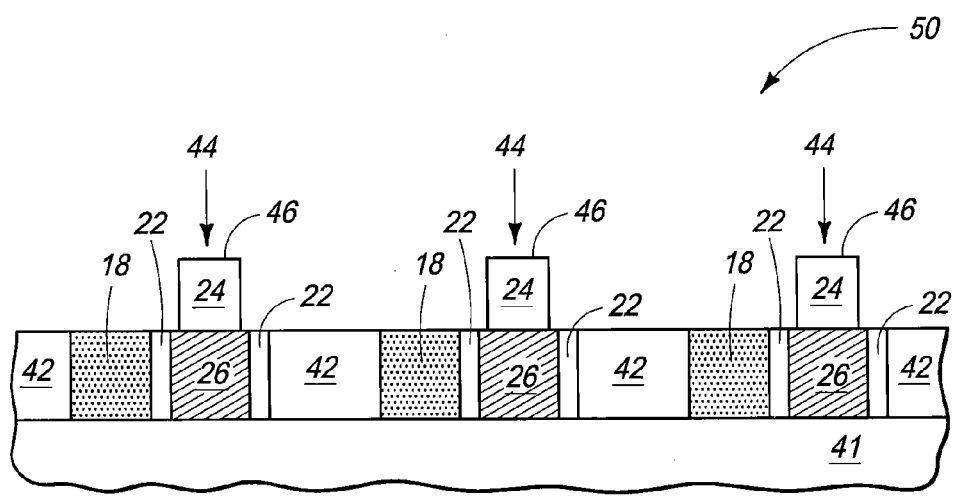

Referring to FIGS. 14 and 15, the other of select device material 24 or programmable material 24 is formed elevationally outward of and in current conductive connection with current conductive material 26. In one embodiment, material 24 has been formed into a plurality of lines 46 that are respectively elevationally over and along current conductive material 26 within respective trenches 44. As an example, such may be formed by deposition of material(s) 24 followed by subtractive patterning thereof.

Figure 16:
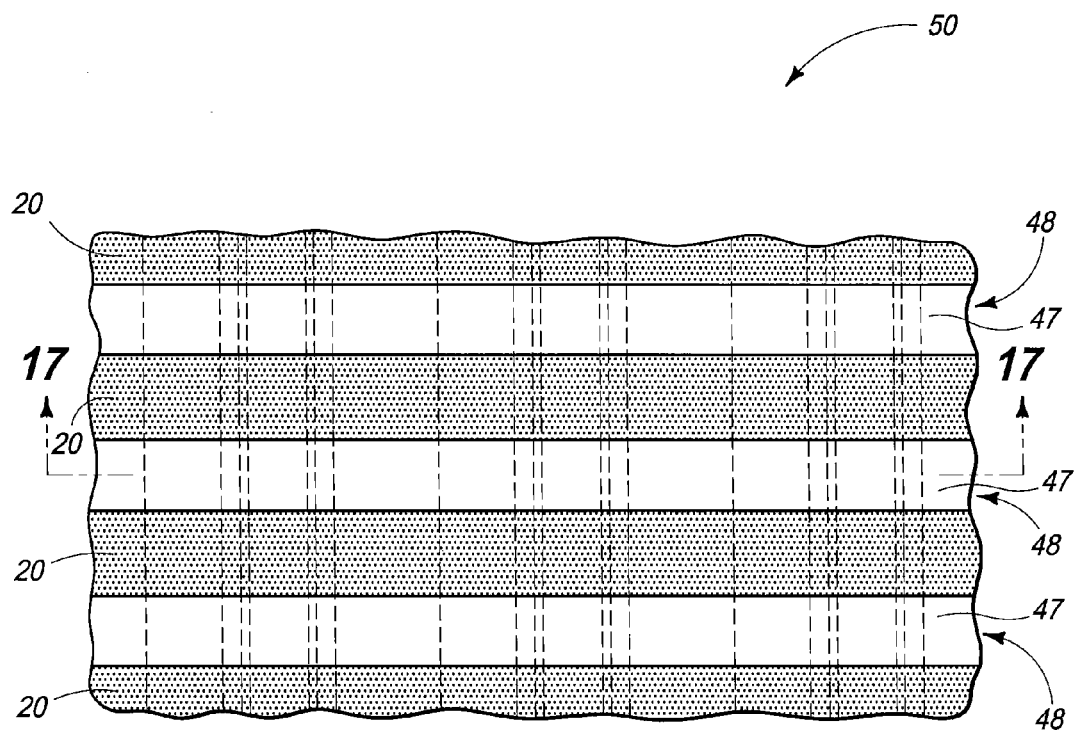
Figure 17:
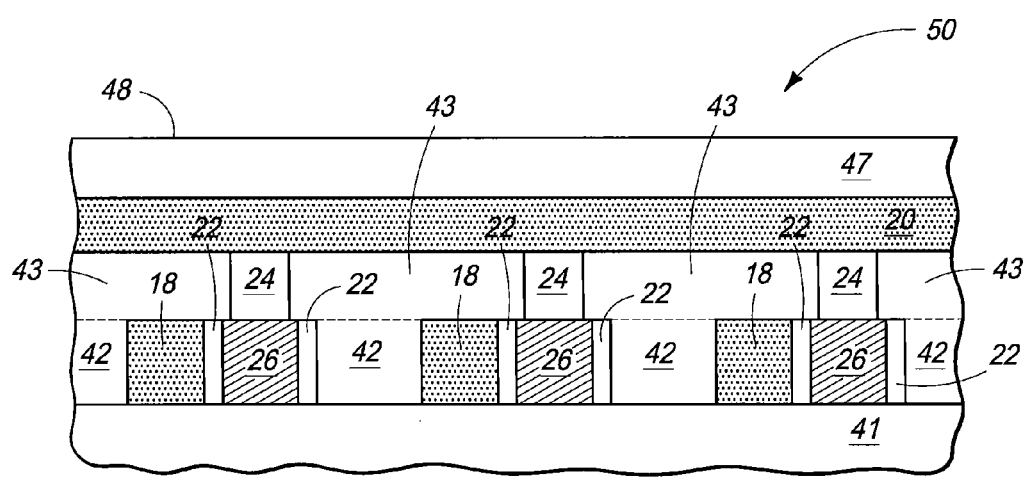

A plurality of second horizontally oriented electrode lines is formed over and in current conductive connection with the other of the select device material or the programmable material. In one embodiment, such second electrode lines are formed to cross the first electrode lines, and in one embodiment to do so orthogonally. Regardless, one example embodiment of forming an example plurality of second horizontally oriented electrode lines is described with reference to FIGS. 16-19. Referring to FIGS. 16 and 17, additional dielectric material 43 has been deposited and planarized back at least to the elevationally outermost surface of material 24. Dielectric material 43 may be of the same or different composition as that of dielectric material 42. Subsequently, second electrode material 20 is deposited thereover in current conductive connection with material 24. Suitable masking material 47 has been formed over second electrode material 20, and has been patterned to form second electrode line patterns 48. In one embodiment, such comprises an example masking step.

Figure 18:
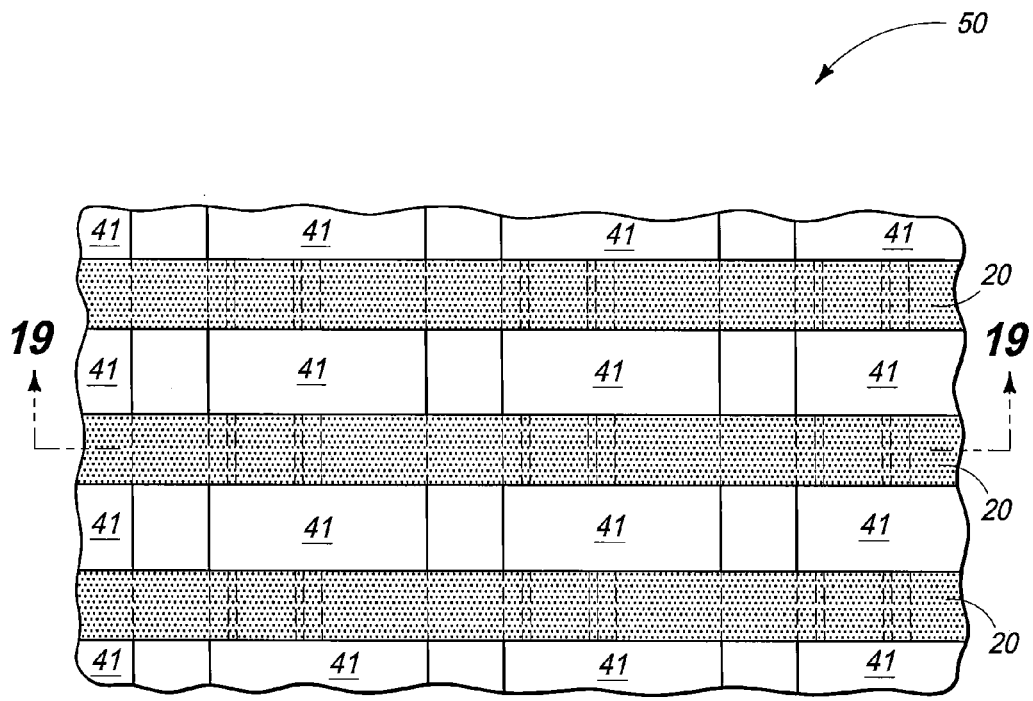
Figure 19:
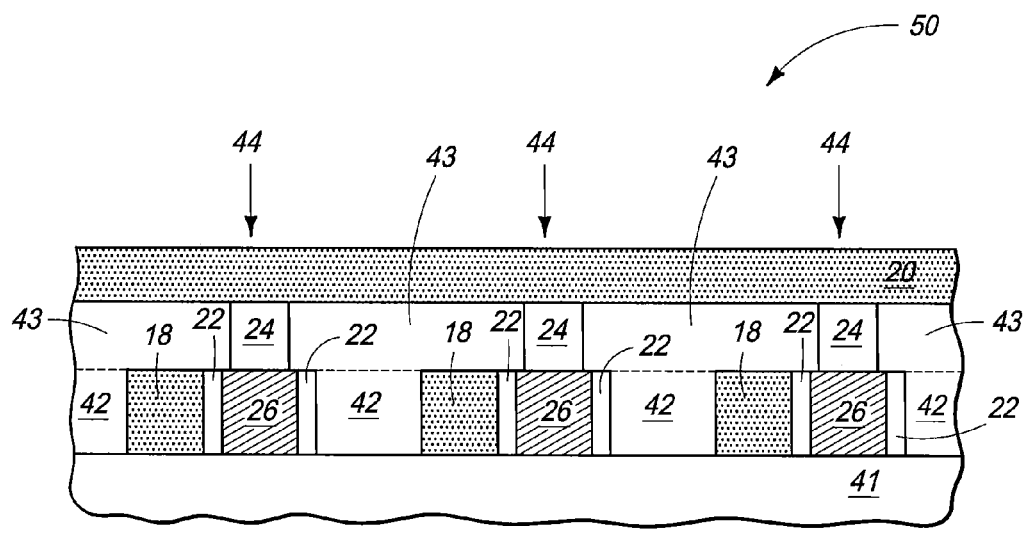

Referring to FIGS. 18 and 19, the mask pattern of FIGS. 16 and 17 has been used as a mask while etching into material 20 to form second electrode lines 20 therefrom, and masking material 17 (not shown) has been removed. In one embodiment and as shown, materials 24, 22, 26, 42, and 43 have been anisotropically subtractively etched selectively relative to material 18, for example using the FIGS. 16 and 17 masking step. Some isotropic lateral etching of any such materials selectively relative to one or more of the others may also be conducted.

In one embodiment, formation of the current conductive material may comprise subtractive patterning thereof, and in one embodiment orthogonally relative to the trenches (for example, as shown). Such may use the same masking step as other patterning, for example that of FIGS. 16 and 17 used to form lines 20 in FIGS. 18 and 19, and regardless of whether some or all of masking material 47 remains over material 20 while etching some or all of materials 24, 22, 26, 42, and 43. Alternately as an example, a separate dedicated masking step may be used.

The above describes but example embodiments of methods of forming a horizontal array of nonvolatile memory cells, for example having the configuration of the memory cells of an individual tier 12 or 14 of FIG. 1. Such may be repeated one or more times if desired to form an array of vertically stacked tiers of nonvolatile memory cells.

Another example method embodiment of forming an array of vertically stacked tiers of nonvolatile memory cells largely of the example FIG. 1 embodiment is described with reference to FIGS. 20-43. Like numerals from the above-described embodiments are used where appropriate, with some construction differences being indicated with the suffix "c" or with different numerals. Further in FIGS. 20-43, as in FIGS. 6-19, numerals 20, 24, 26, 22 and 18 are used to designate the materials from which such components are fabricated prior to necessarily being of the final example shapes for clarity in the drawings and ease of understanding in the description.

Figure 20:
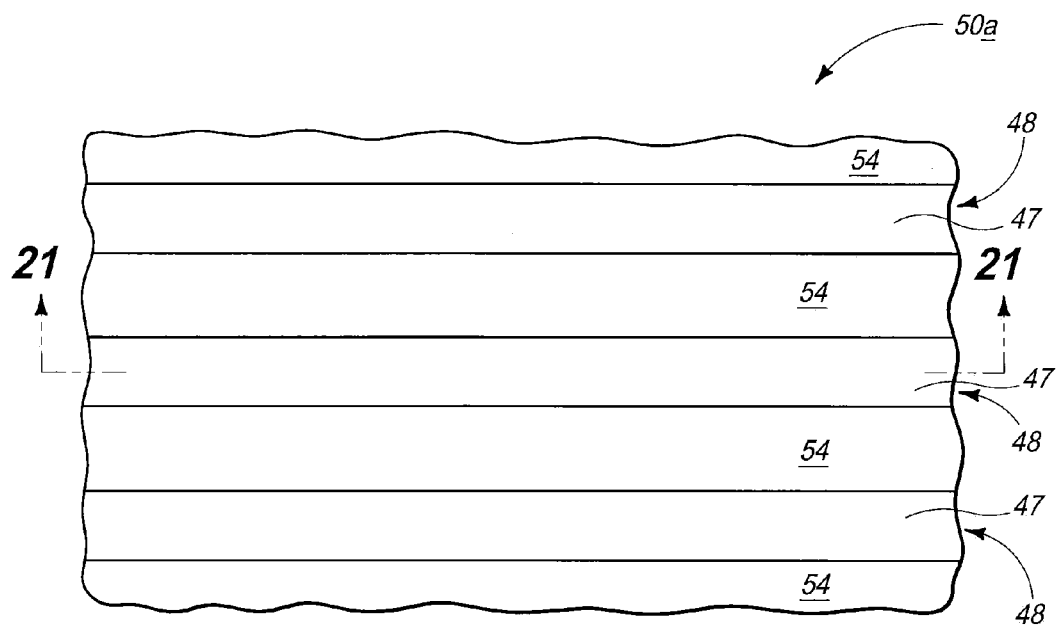
FIGS. 20-43 are diagrammatic top and sectional views of a substrate fragment in process in ultimately producing an array of nonvolatile memory cells in accordance with an embodiment of the invention.
Figure 21:
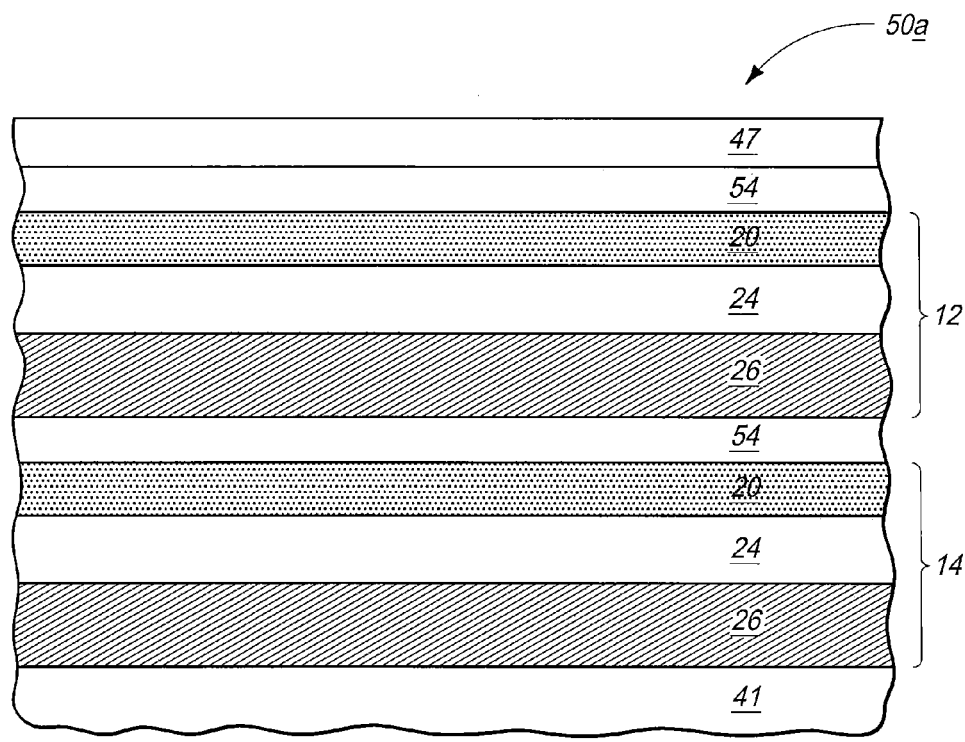

Referring to FIGS. 20 and 21, substrate fragment 50a comprises current conductive material 20, programmable or select device material 24, current conductive material 26, intervening dielectric material 54, and base substrate 41. Accordingly, in one embodiment, such are provided relative to individual tiers 12 and 14 in which respective first and second pluralities of horizontal lines and associated individual memory cells will be formed. Dielectric material 54 may comprise any suitable dielectric, and may be homogenous or non-homogenous. Such is also shown as being over tier 12. A suitable mask pattern has been formed thereover of one or more masking materials 47, thereby forming mask lines 48 which may be used to ultimately form lines of material 20 to produce that depicted by the example embodiment in FIG. 1.

Figure 22:
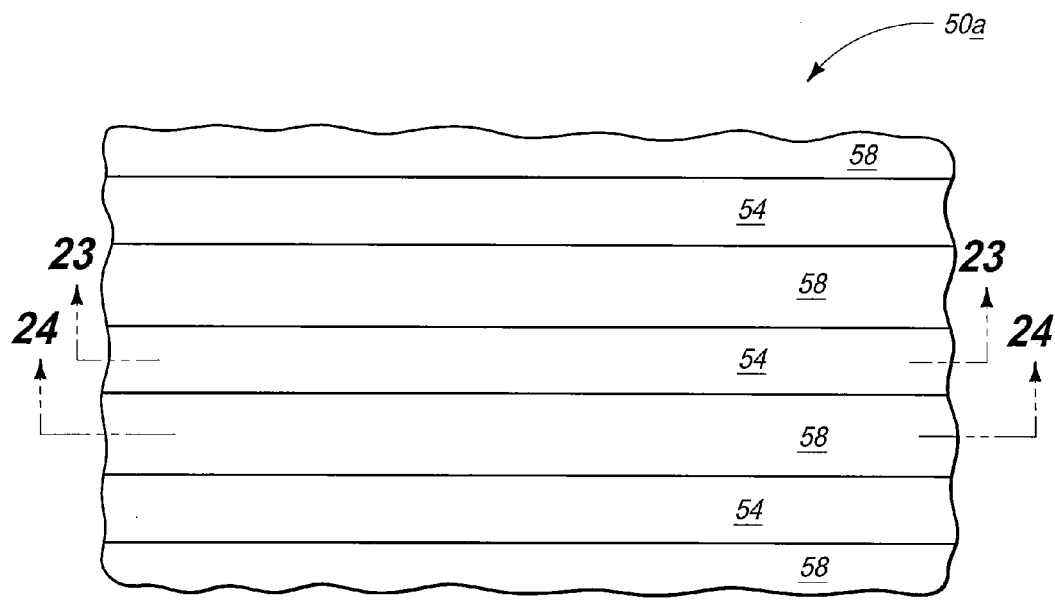
Figure 23:
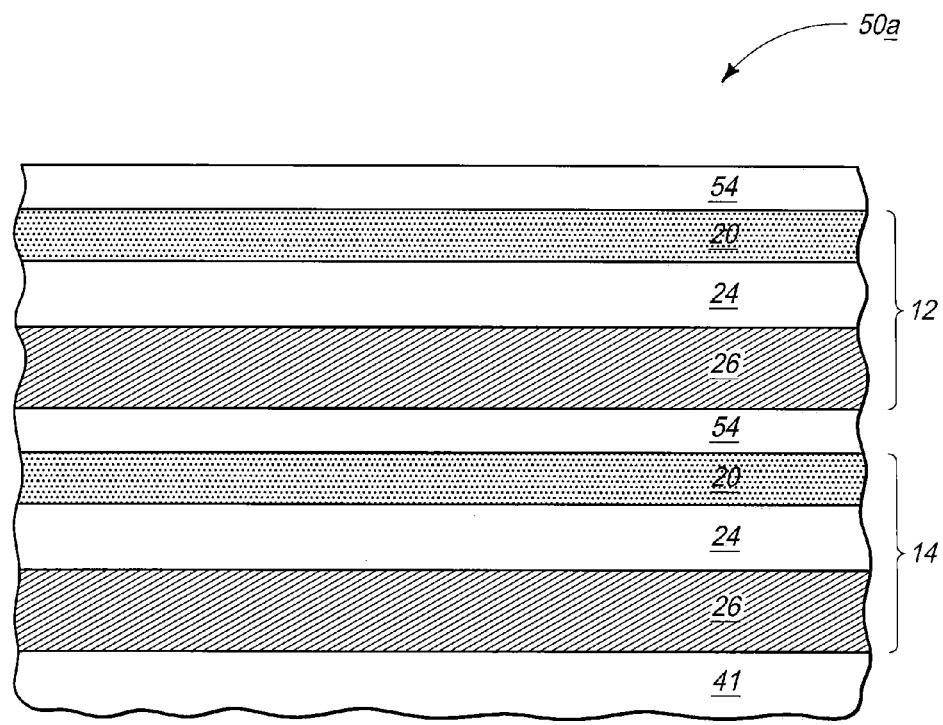
Figure 24:
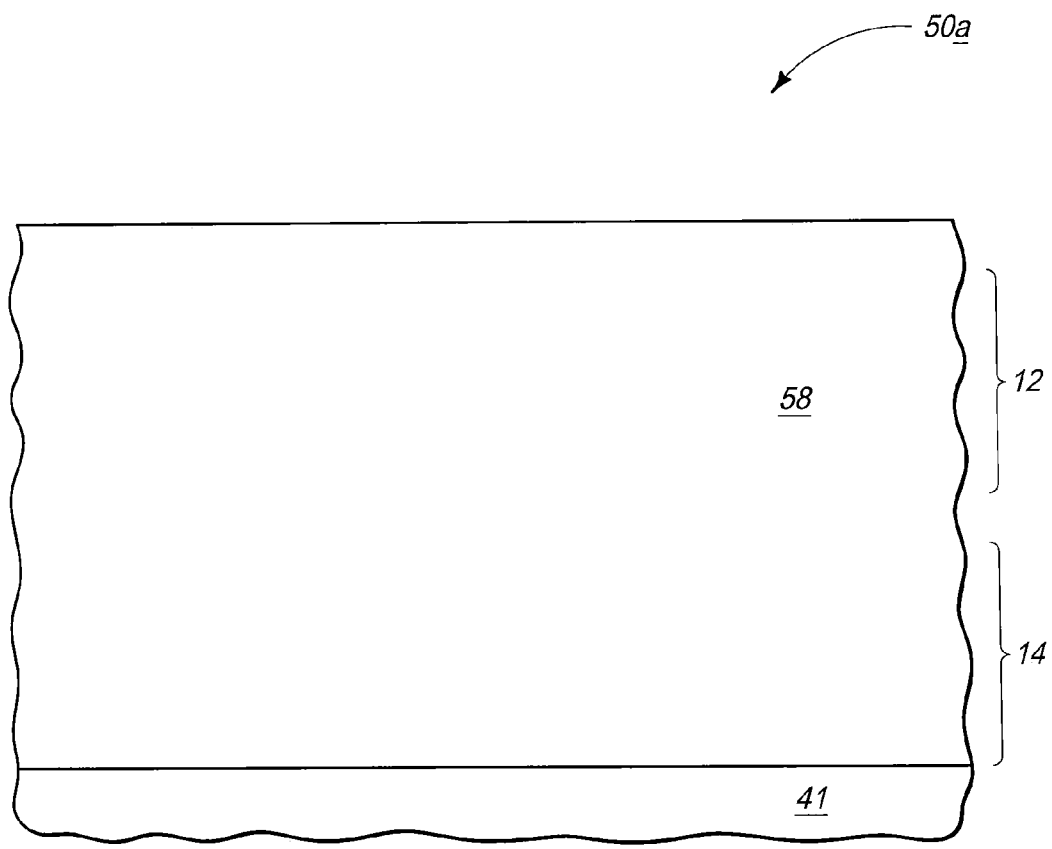

Referring to FIGS. 22-24, suitable anisotropic dry etching has been conducted through each of the depicted layers 54, 20, 24, 26, 54, 20, 24 and 26 to base substrate 41. Such provides but one example of forming horizontally oriented and laterally overlapping first, second, and third lines (i.e., of materials 20, 24 and 26, respectively) within individual tiers 12 or 14 of a plurality of vertically stacked tiers. First line 20 and third line 26 are current conductive and of different composition. Second line 24 is between first line 20 and second line 26, and is of material different in composition from that of first line 20 and third line 26.

Masking material 47 (not shown in FIGS. 22-24) has been removed, and trenches between the respective stacks of lines have been filled with dielectric material 58 ideally of composition different from that of dielectric material 54. Where, for example, dielectric material 54 is silicon dioxide based, an example suitable dielectric material 58 is silicon nitride. Regardless, dielectric material 58 may be homogenous or non-homogenous.

Figure 25:
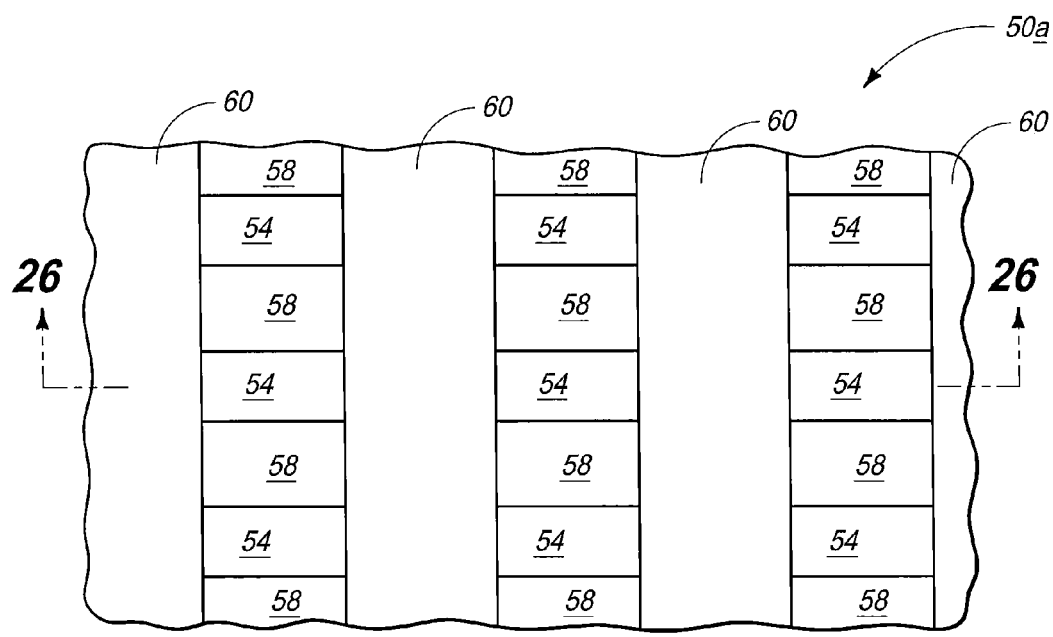
Figure 26:
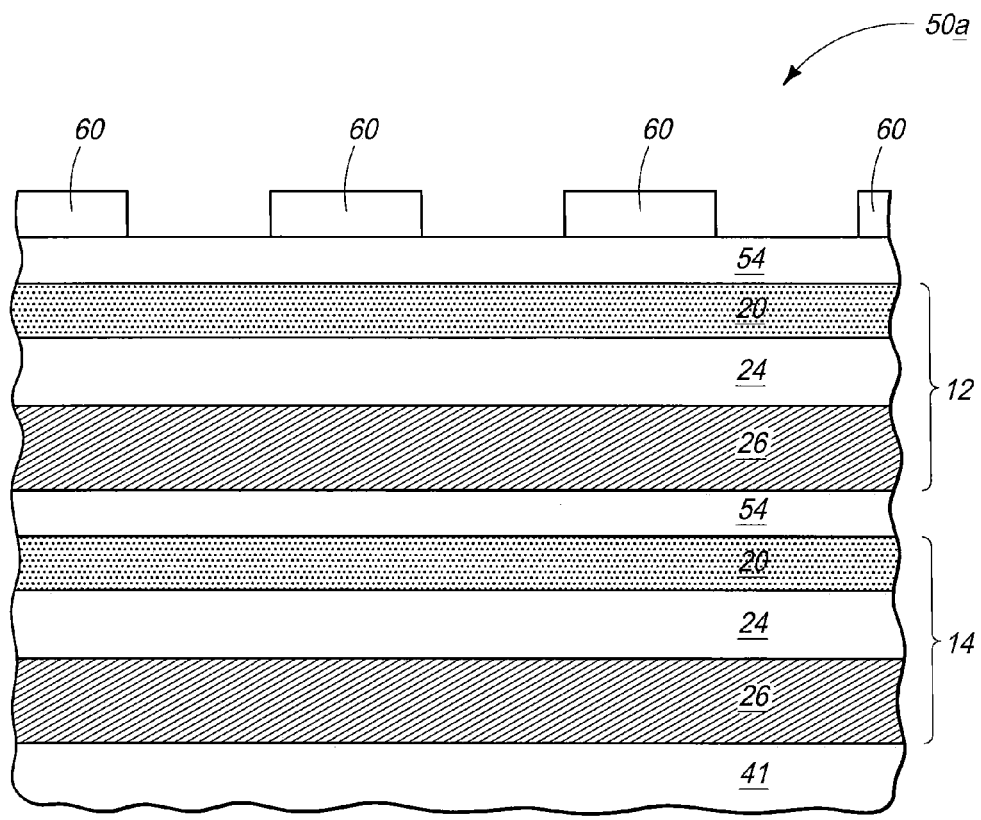

Referring to FIGS. 25 and 26, masking material 60 has been deposited and patterned as shown, for example to form masking lines respectively extending along a y-axis direction.

Figure 27:
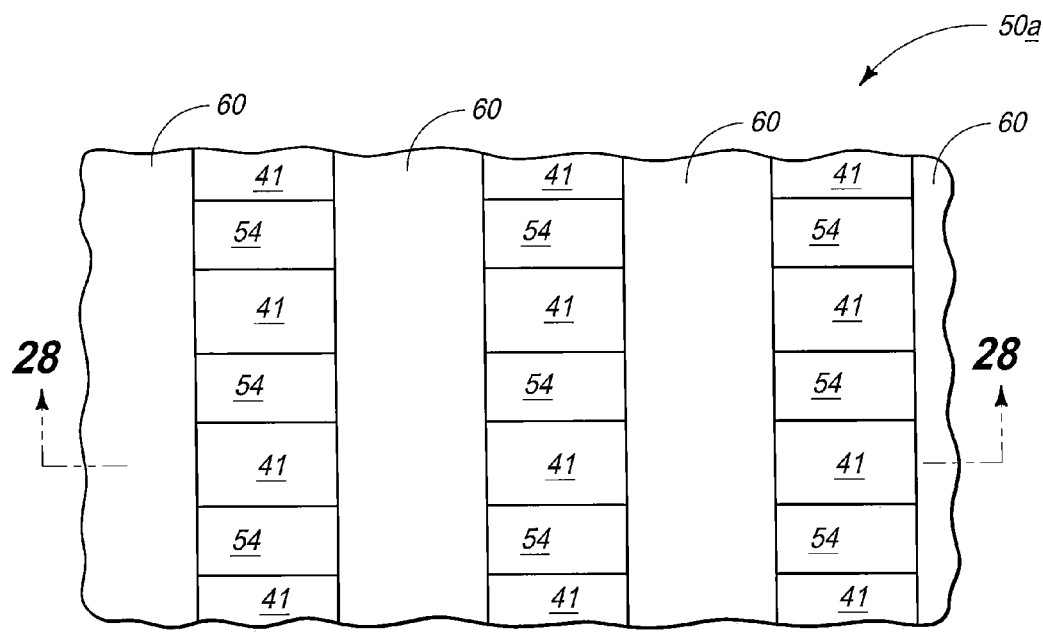
Figure 28:
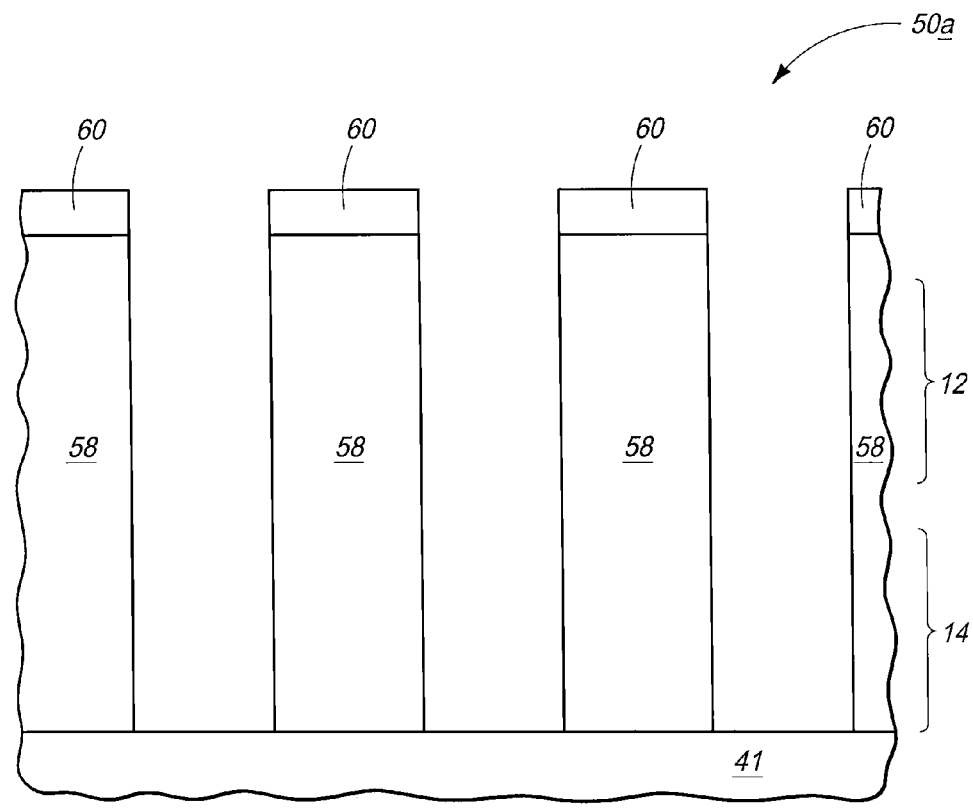

Referring to FIGS. 27 and 28, dielectric material 58 has been anisotropically etched through tiers 12 and 14 inwardly to base substrate 41 using material 60 as a mask. Such may be conducted selectively relative to materials 60, 54, 20, and 24 whereby the cross section depicted by FIG. 26 remains largely unchanged at the end of the processing depicted by FIGS. 27 and 28.

Figure 29:
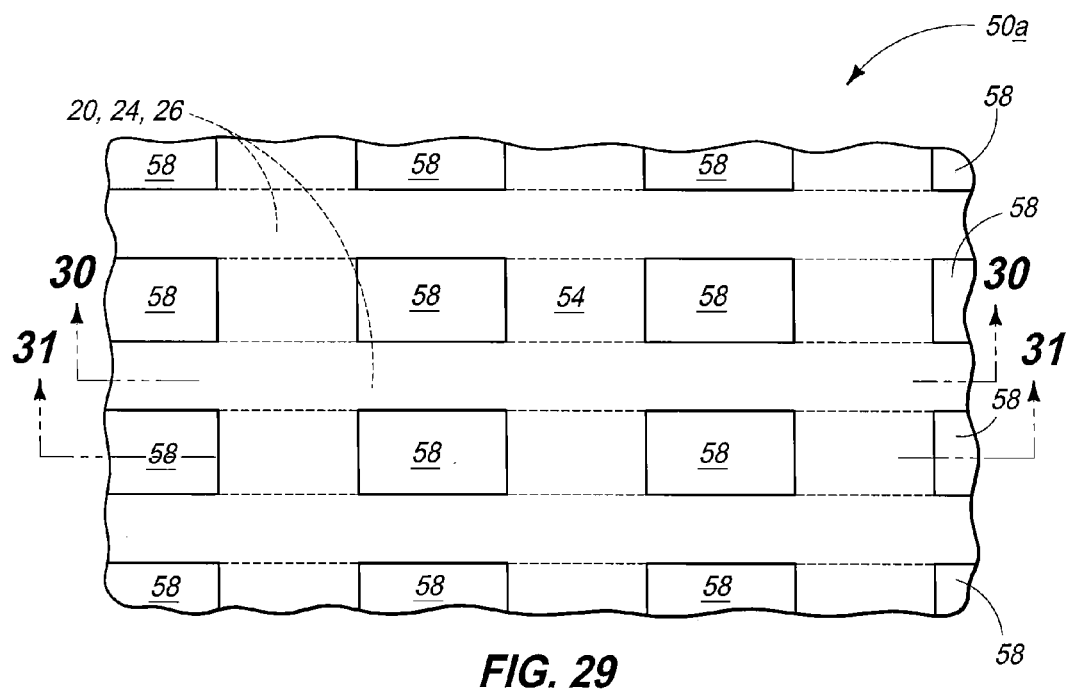
Figure 30:
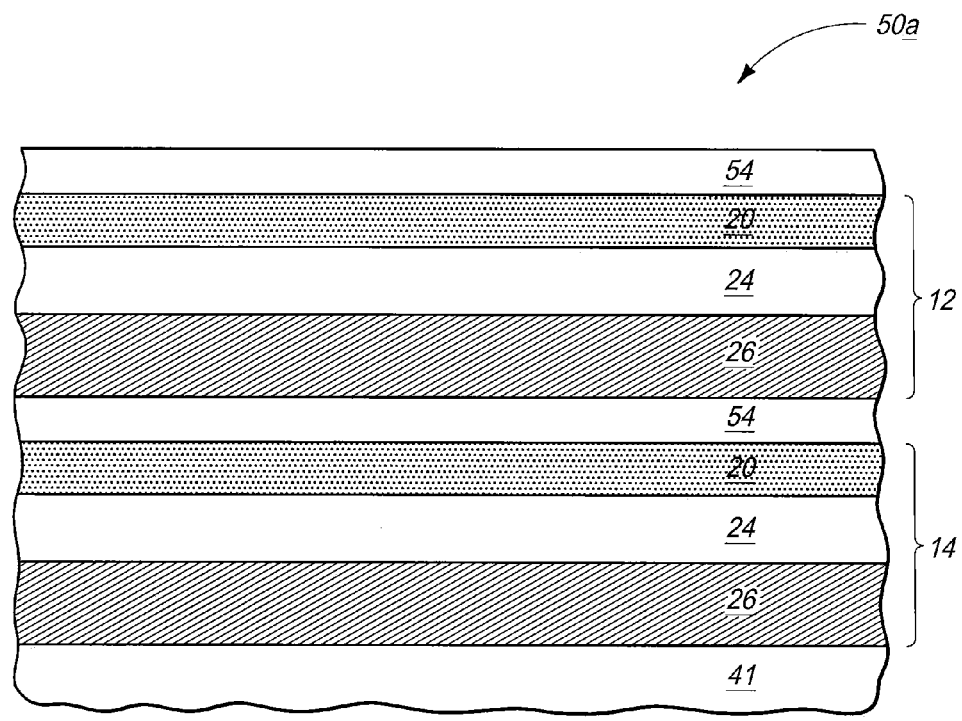
Figure 31:
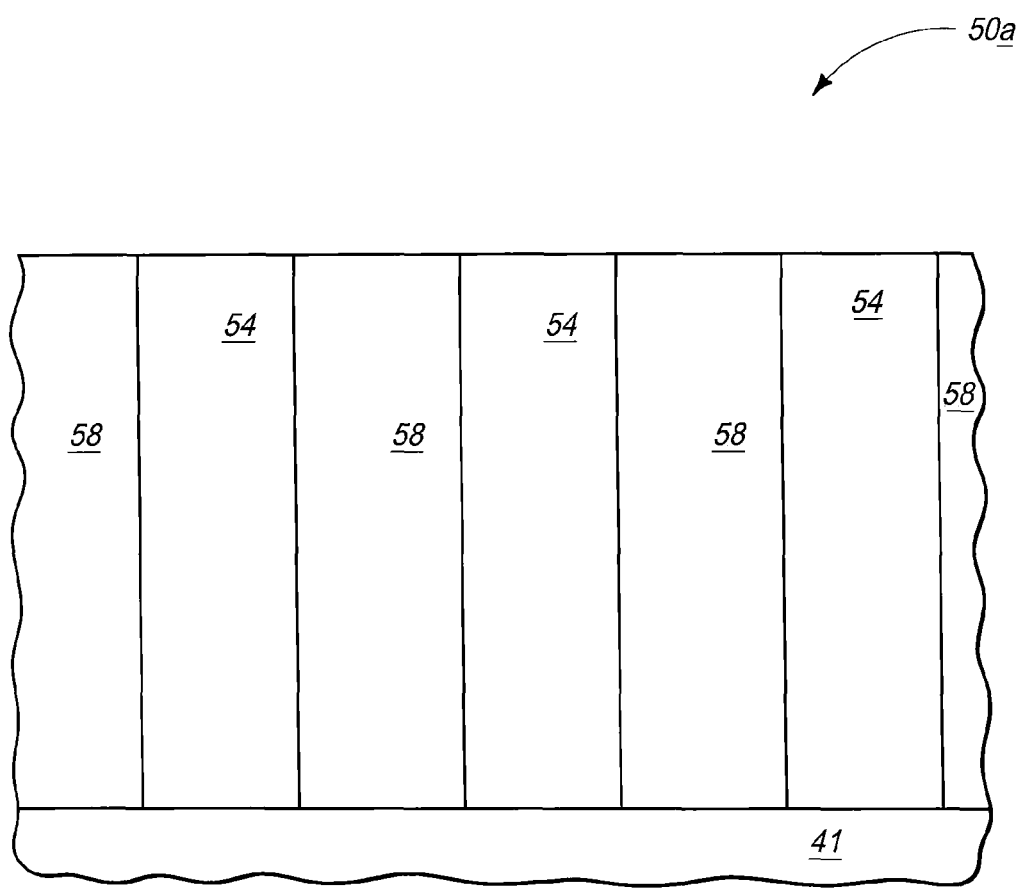

Referring to FIGS. 29-31, masking material 60 (not shown) has been removed and the void spaces of FIGS. 27 and 28 filled with dielectric material which, in one embodiment, may be of the same composition as that of material 54 and is so shown and designated in the figures.

Figure 32:
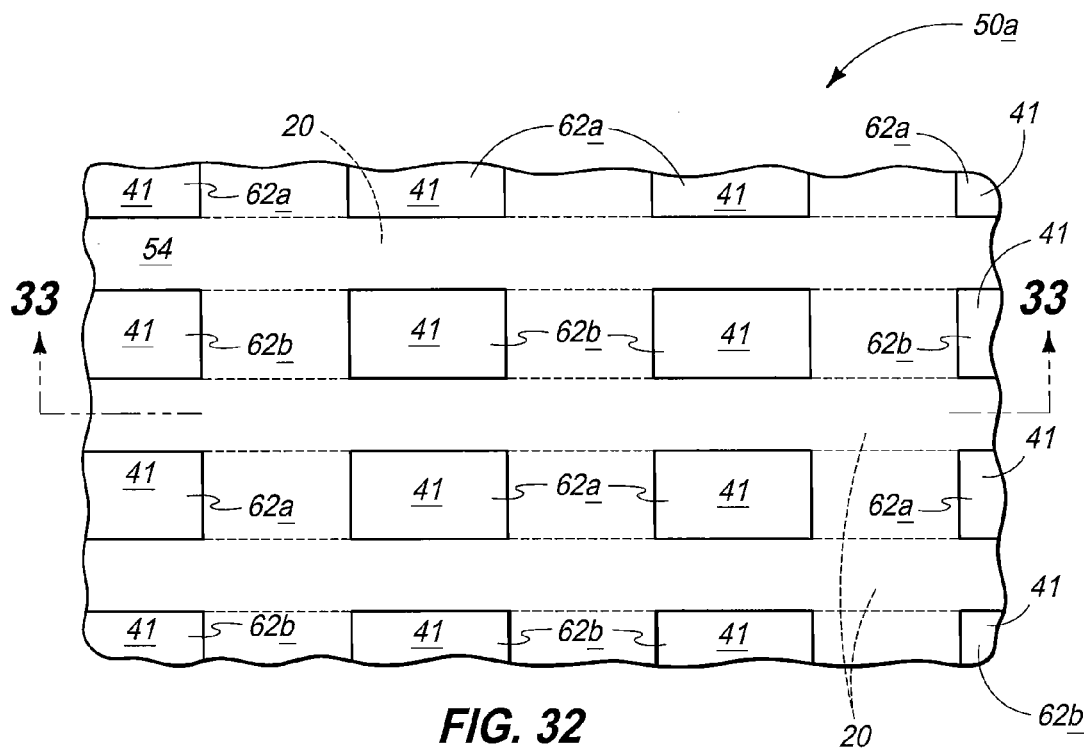
Figure 33:
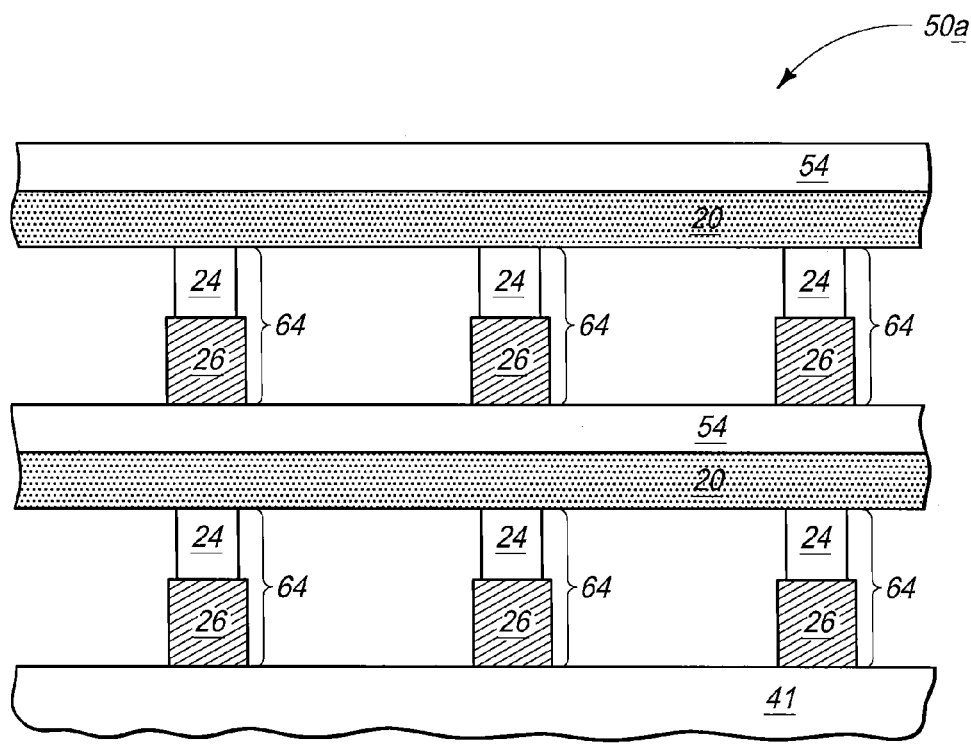

Referring to FIGS. 32 and 33, dielectric material 58 (not shown) has been etched selectively relative to dielectric material 54 inwardly to base substrate 41. Such thereby forms pairs of vertically extending and longitudinally aligned openings 62a, 62b through tiers 12, 14 on laterally opposing sides of first lines 20, second lines 24, and third lines 26 that are within individual tiers 12, 14. Subsequently, etching has been conducted laterally through second and third lines 24 and 26 between the respective pairs of openings 62a, 62b to form longitudinally spaced masses 64 which extend vertically relative to first lines 20. Masses 64 respectively comprise material of the former second lines 24 and third lines 26.

Figure 34:
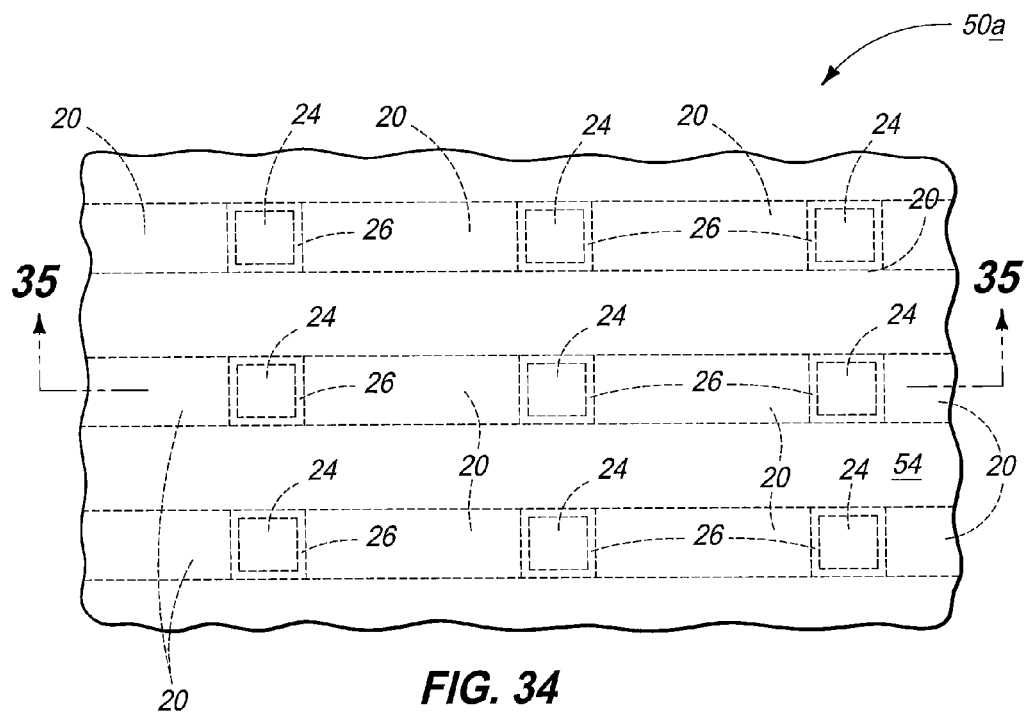
Figure 35:
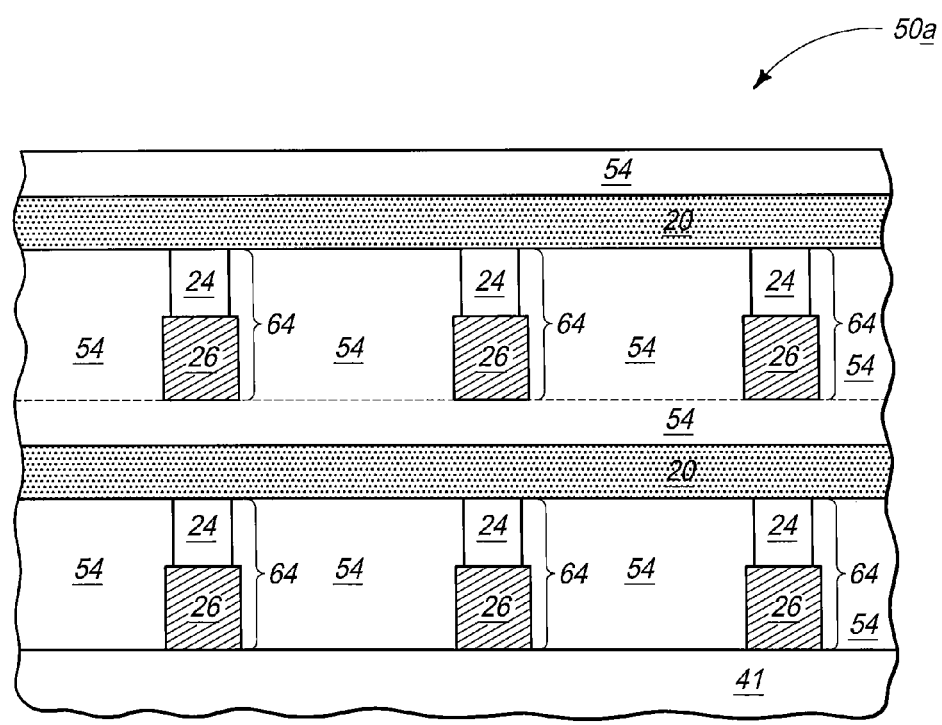

Referring to FIGS. 34 and 35, openings 62a, 62b of FIGS. 28 and 29 and remaining void space have been filled with dielectric material which, in one embodiment, may be of the same composition as that of material 54 and is so shown in the figures.

Figure 36:
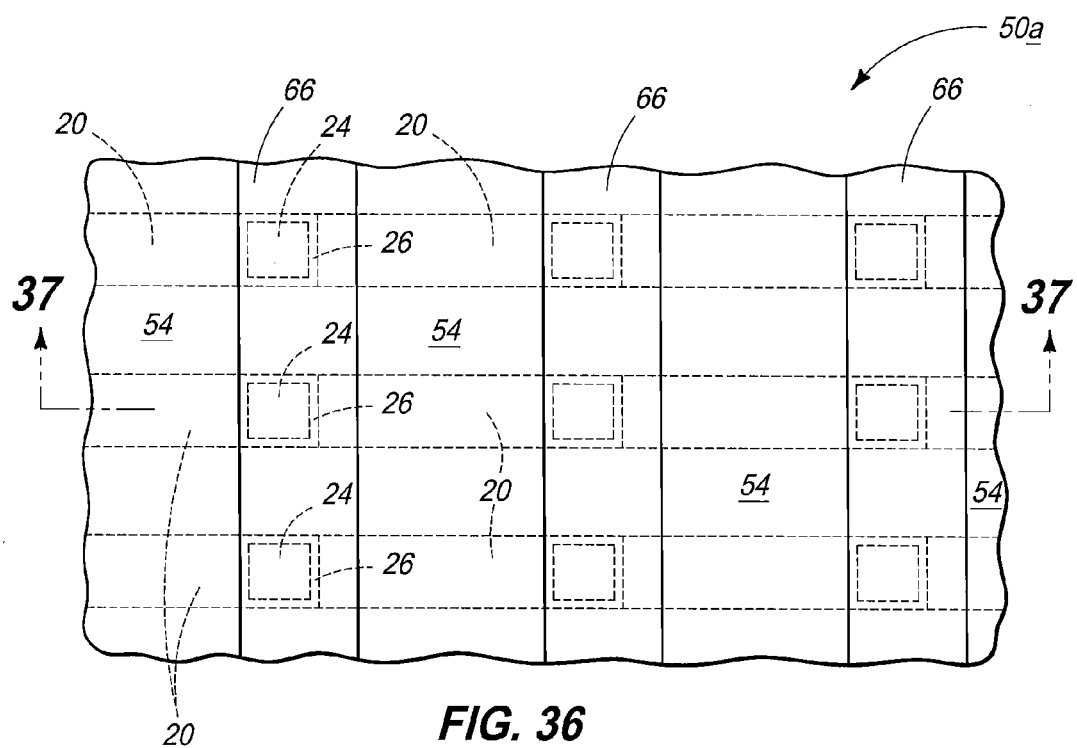
Figure 37:
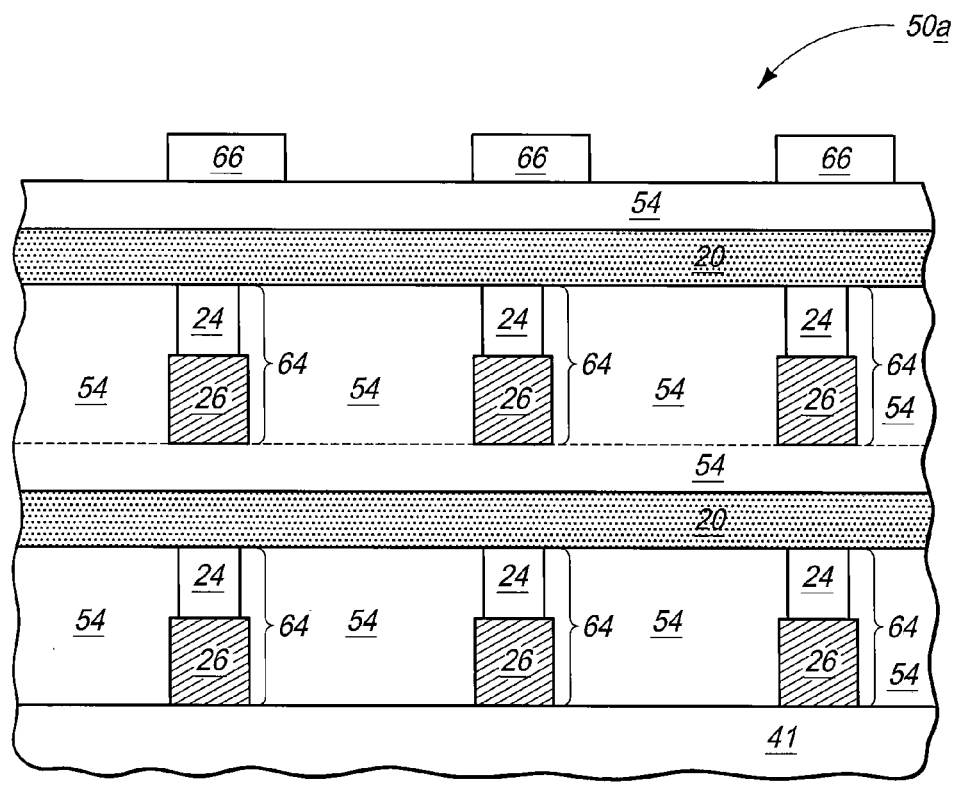

Referring to FIGS. 36 and 37, masking material 66 has been formed and patterned over the substrate as shown.

Figure 38:
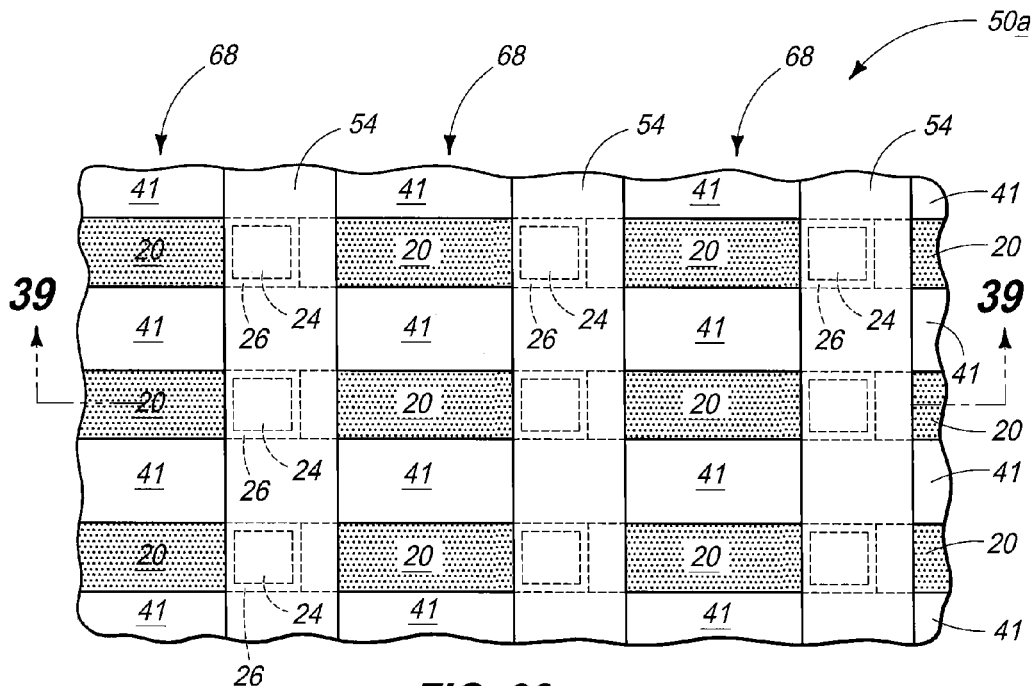
Figure 39:
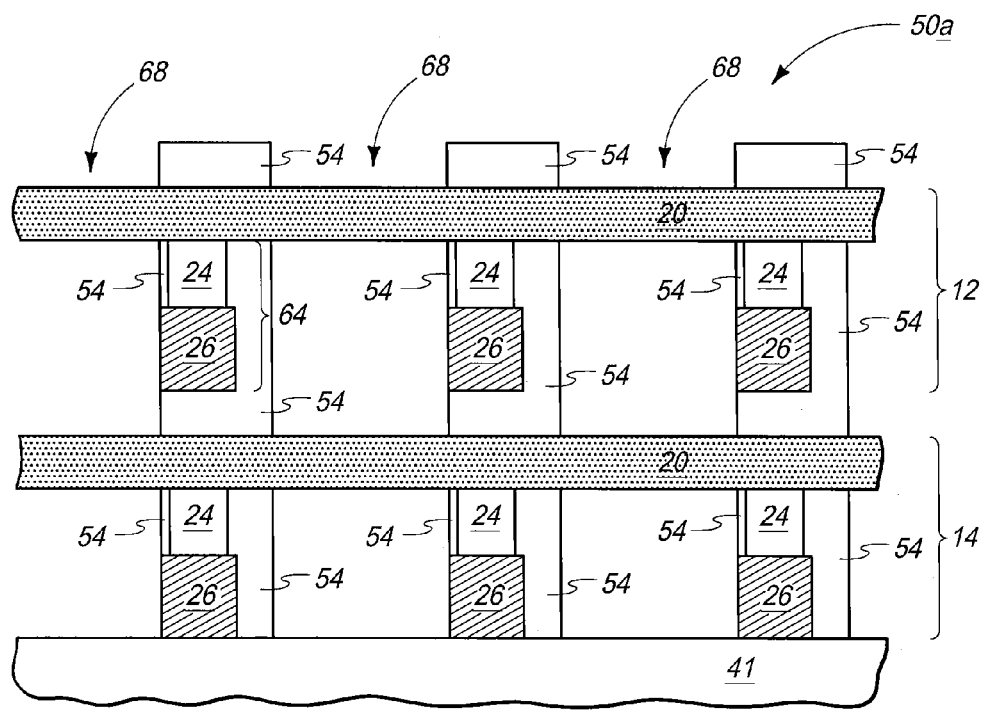

Referring to FIGS. 38 and 39, exposed dielectric material 54 has been anisotropically etched to form a plurality of horizontally elongated trenches 68 (along the y-axis in the FIG. 38 top view) within dielectric material 54 through tiers 12 and 14, and which cross first lines 20. In one embodiment and as shown, trenches 68 cross first lines 20 orthogonally. Additionally, trenches 68 expose only one of two opposing sides of the respective masses 64, for example the left illustrated sides and remain covering laterally over the right illustrated sides.

Figure 40:
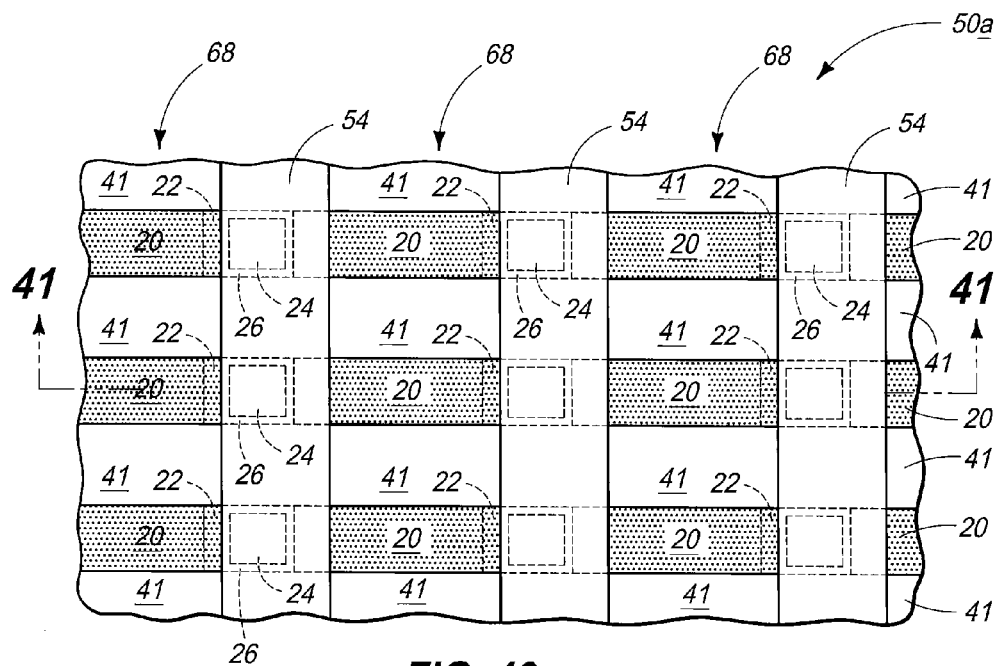
Figure 41:
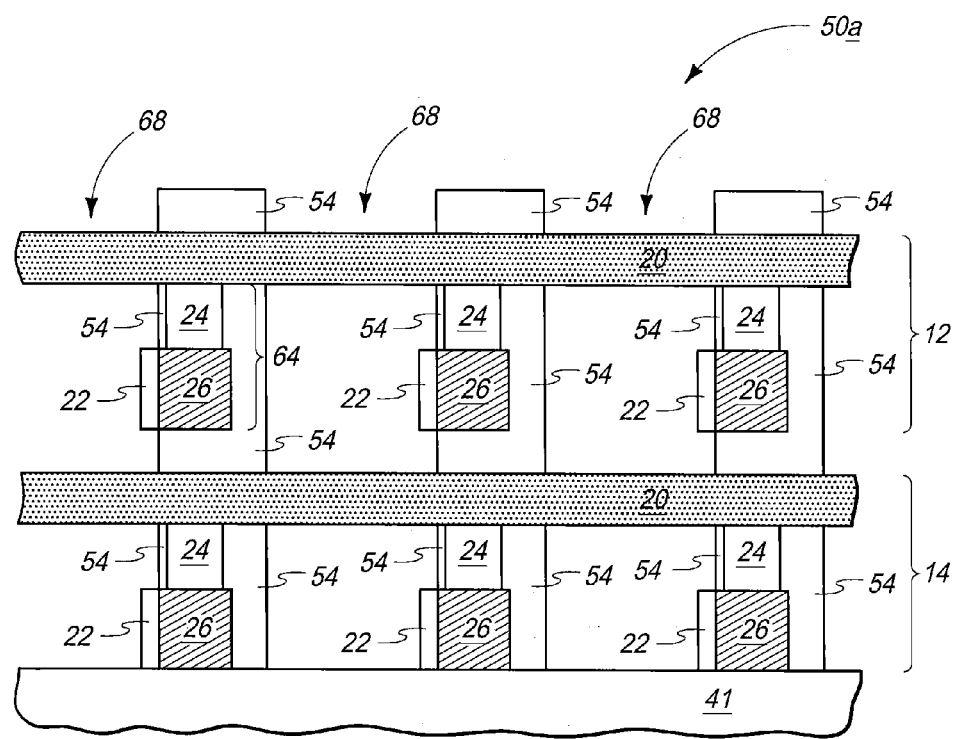

Referring to FIGS. 40 and 41, one of select device material 22 or programmable material 22 is selectively grown from current conductive material 26 of the respective one exposed lateral side of masses 64. By way of examples only, example programmable materials include $TiON$, $CuO_x$, $WO_x$, and $TaON$. Such may be grown selectively from TiN, Cu, W, or TaN, respectively, in a plasma assisted oxygen-containing ambient at from about 100° C. to about 300° C. at any suitable atmospheric, sub-atmospheric or greater than atmospheric pressure, at a suitable power of from 10 Watts to 5,000 Watts. Such may not appreciable grow from silicon nitride, silicon dioxide, platinum, and palladium. Therefore as an example, any such programmable material 22 may so selectively grow when material 20 comprises platinum and/or palladium, and materials 24 and 54 comprise one or both of silicon dioxide or silicon nitride. As another example for such materials 20, 24, and 54, a programmable material of germanium antimony tellurium may be selectively grown relative to a tungsten-comprising conductor 26 by CVD and/or ALD using tetrakis (dimethylamino)germane, tris(dimethylaminmo) antimony, and di-tert-butyltelluride as respective germanium, antimony, and tellurium precursors at a temperature range of from about 200° C. to about 400° C., and at a pressure range of from about 1 Torr to about 50 Torr.

An example select device material 22 comprises semiconductive material (e.g., silicon and/or InAs), for example configured to form a p/n diode. For example if conductive material 26 comprises conductively doped silicon, a silicon-comprising select device 22 may be epitaxially selectively grown from material 26 without appreciable growth on materials 41, 54 and 51 where such do not comprise exposed elemental-form silicon. Such may be suitably conductively doped with one or both of p-type or n-type dopants during growth or may be doped subsequently (e.g., by gas phase doping and/or ion implanting). As an additional example, SiC as part of a select device may be selectively grown from silicon using a reaction of a hydrocarbon precursor or rapid thermal chemical vapor deposition using the pyrolysis of propane or other hydrocarbon gas precursors, for example as disclosed in P. H. Yih, et al., "SiC/Si Heterojunction Diodes Fabricated by Self-Selective and by Blanket Rapid Thermal Chemical Vapor Deposition", IEEE Transactions on Electron Devices, Vol. 41, No. 3, (March 1994). Further, AlGaN may be selectively grown from GaN to form a p-n diode as a select device, for example as disclosed in H. Xing, et al., "Characterization of AlGaN/GaN p-n diodes with selectively regrown n-AlGaN by metal-organic chemical-vapor deposition and its application to GaN-based bipolar transistors", Journal Of Applied Physics 97, 113703 (2005).

Figure 42:
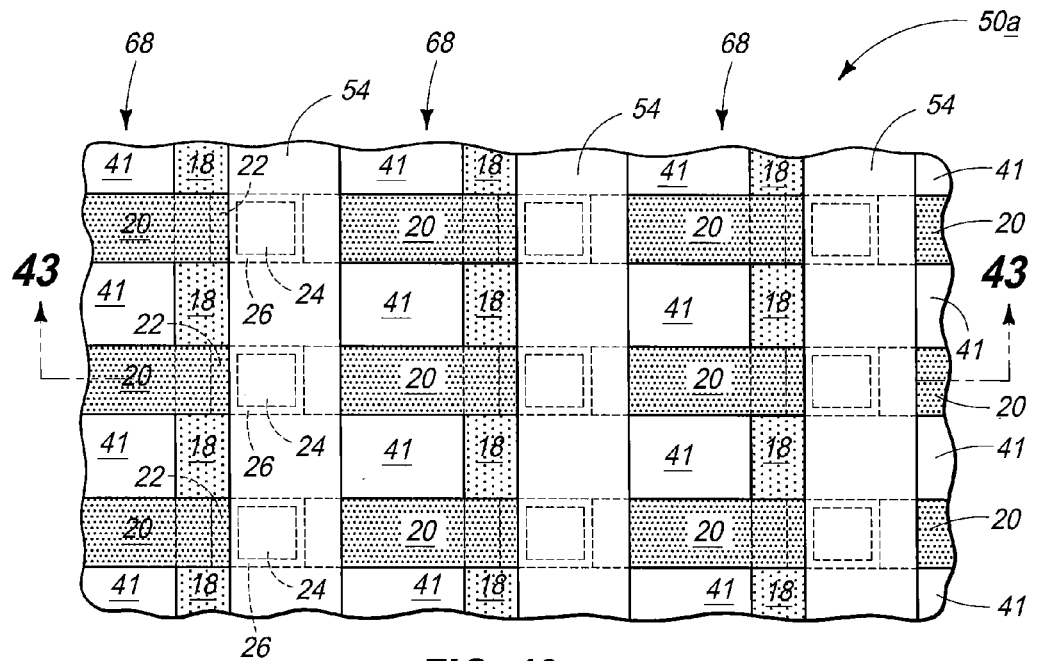
Figure 43:
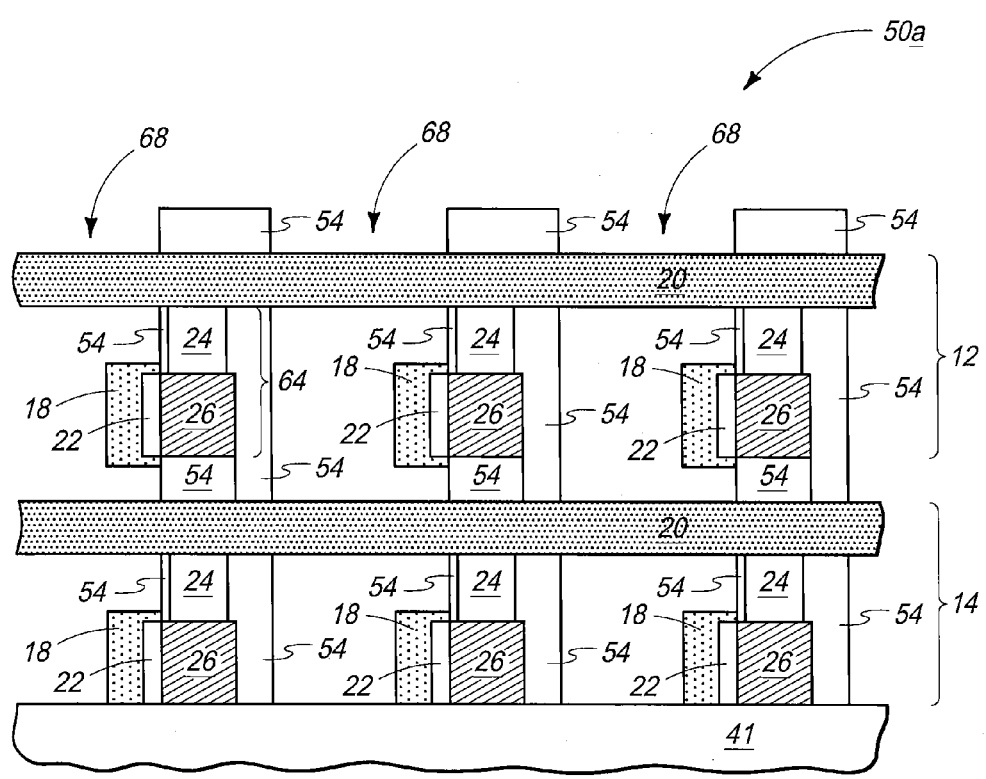

Referring to FIGS. 42 and 43, current conductive material 18 has been selectively grown from material 22 to form a plurality of horizontally oriented electrode lines 18 within individual tiers 12 and 14. The so-grown horizontally oriented electrode lines 18 bridge horizontally between material 22 of adjacent masses 64. As but one example, the growth of conductive material 18 may be uniform in all directions. Yet if the distance between adjacent masses of materials 22 in a tier is sufficiently small, material 18 will merge to form a line horizontally. As an example, a $CoSi_2$ material 18 may be formed by cobalt reacting with a silicon-comprising material 22. Unreacted cobalt may then be removed by a wet etch process. Other metal silicides may be used. As other examples, metal may be photoselectively deposited on silicon p/n diodes, or by selective metal electrodeposition that relies on the doping of the semiconductor. Further, selective growth of conductive material 18 on material 22 may be photostimulated selective electroless Ag or Cu deposition on $TiO_2$. These and other techniques may be used as known by artisan, and for example as described in Kooij et al., "Photoselective Metal Deposition on Amorphous Silicon p-i-n Solar Cells", J. Electrochemical Society, Volume 144, No. 10, October 1997 and Scheck et al., "Selective metal electrodeposition through doping modulation of semiconductor surfaces", Applied Physics Letters 86, 188108 (2005).

An embodiment of the invention encompasses a method of forming an array of vertically stacked tiers of nonvolatile memory cells. In such, horizontally oriented current conductive lines having longitudinally spaced masses extending vertically therefrom are formed within individual of the tiers. The masses respectively comprise current conductive material and other material between the current conductive material and the current conductive lines. The other material is of different composition from that of the current conductive material and the current conductive lines. The above example embodiment of FIGS. 20-33 show formation of example such current conductive lines 20 having longitudinally spaced masses 64 extending vertically there-from (FIG. 33).

A plurality of horizontally elongated trenches is formed within dielectric material through the plurality of tiers and which cross the current conductive lines. Such trenches expose only one of two opposing lateral sides of the respective masses. The processing shown in FIGS. 33-39 depicts such example processing.

One of select device material or programmable material is selectively grown from the current conductive material of the one lateral side of the masses. FIGS. 40 and 41 depict such example processing.

Current conductive material is selectively grown from the one of the selectively grown select device material or programmable material to form a plurality of horizontally oriented electrode lines within the individual tiers. Such selectively grown horizontally oriented electrode lines bridge horizontally between the current conductive material of adjacent of the masses. The above-described processing with respect to FIGS. 42 and 43 is but one such example.

Regarding the programmable material, one example is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_xTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, such material may be statically programmable semiconductive material which comprises mobile dopants that are received within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, $AlQ_3Ag$, Cu-TCNQ, DDQ, TAPA, and fluorescine-based polymers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of nonvolatile memory cells, comprising:
a plurality of vertically stacked tiers of nonvolatile memory cells, individual of the tiers comprising:
   a first plurality of horizontally oriented first electrode lines;
   a second plurality of horizontally oriented second electrode lines crossing relative to the first electrode lines; and
individual of the memory cells comprising:
   a crossing one of the first electrode lines and one of the second electrode lines;
   programmable material, a select device in series with the programmable material, and current conductive material in series between and with the programmable material and the select device; the programmable material and the select device being in series with such crossing ones of the first and second electrode lines; and
   the programmable material and the select device are oriented for predominant current flow into or out of the crossing one first electrode line out of or into, respectively, one of the programmable material or select device in a horizontal direction, and for predominant current flow into or out of the crossing one second electrode line out of or into, respectively, the other of the programmable material and select device in a vertical direction.

2. The array of claim 1 wherein the crossing one first electrode line extends along a first axis, the one of the programmable material or select device that is oriented for predominant current flow in the horizontal direction being oriented for predominant current flow into or out of the first electrode line perpendicular to the first axis.

3. The array of claim 1 wherein the select device is oriented for predominant current flow into or out of the respective second electrode line in the vertical direction and the programmable material is oriented for predominant current flow into or out of the respective first electrode line in the horizontal direction.

4. The array of claim 3 wherein the select device is directly against the respective second electrode line.

5. The array of claim 3 wherein the programmable material is directly against the respective first electrode line.

6. The array of claim 3 wherein the select device is directly against the respective second electrode line, and the programmable material is directly against the respective first electrode line.

7. The array of claim 1 wherein the programmable material is oriented for predominant current flow into or out of the respective second electrode line in the vertical direction and the select device is oriented for predominant current flow into or out of the respective first electrode line in the horizontal direction.

8. The array of claim 7 wherein the programmable material is directly against the respective second electrode line.

9. The array of claim 7 wherein the select device is directly against the respective first electrode line.

10. The array of claim 7 wherein the programmable material is directly against the respective second electrode line, and the select device is directly against the respective first electrode line.

11. The array of claim 1 wherein the plurality of vertically stacked tiers comprise multiple pairs of two immediately adjacent tiers, the two immediately adjacent tiers of the respective pairs sharing one of said first or second pluralities.

12. The array of claim 11 wherein,
one of the two immediately adjacent tiers of the respective pairs is an elevationally outer tier and another of the two immediately adjacent tiers of the respective pairs is an elevationally inner tier; and
predominant current flow within the outer tier into or out of the programmable material or select device out of or into, respectively, individual of the electrode lines of the shared one of said first and second pluralities is in the horizontal direction.

13. The array of claim 11 wherein,
one of the two immediately adjacent tiers of the respective pairs is an elevationally outer tier and another of the two immediately adjacent tiers of the respective pairs is an elevationally inner tier; and
predominant current flow within the inner tier into or out of the programmable material or select device out of or into, respectively, individual of the electrode lines of the shared one of said first and second pluralities is in the vertical direction.

14. The array of claim 11 wherein,
one of the two immediately adjacent tiers of the respective pairs is an elevationally outer tier and another of the two immediately adjacent tiers of the respective pairs is an elevationally inner tier;
predominant current flow within the outer tier into or out of the programmable material or select device out of or into, respectively, individual of the electrode lines of the shared one of said first and second pluralities is in the horizontal direction; and
predominant current flow within the inner tier into or out of the programmable material or select device out of or into, respectively, individual of the electrode lines of the shared one of said first and second pluralities is in the vertical direction.

15. The array of claim 1 wherein no immediately adjacent tiers share any electrode lines of said first and second pluralities.

16. An array of vertically stacked tiers of nonvolatile memory cells, comprising multiple pairs of two immediately adjacent tiers, said two immediately adjacent tiers of the respective pairs comprising a shared plurality of horizontally oriented electrode lines, an elevationally outer of said two immediately adjacent tiers of the respective pairs comprising an elevationally outer plurality of horizontally oriented electrode lines, an elevationally inner of said two immediately adjacent tiers of the respective pairs comprising an elevationally inner plurality of horizontally oriented electrode lines, individual of the memory cells comprising programmable material and a select device operatively between a crossing one of the shared horizontally oriented electrode lines and one of the outer or inner horizontally oriented electrode lines.

17. The array of claim 16 wherein the individual memory cells are oriented for predominant current flow into or out of the programmable material or select device in the horizontal direction, and for predominant current flow into or out of the other of the programmable material and select device in the vertical direction.

18. The array of claim 16 wherein the multiple pairs are no more than two in number.

19. The array of claim 16 wherein the multiple pairs are more than two in number.

20. A method of forming a horizontal array of nonvolatile memory cells, comprising:
forming a plurality of first horizontally oriented electrode lines over a substrate;
forming a plurality of horizontally elongated trenches within dielectric material along only one lateral side of the respective first electrode lines;
lining the trenches with one of select device material or programmable material that is in current conductive connection with said one lateral side of the respective first electrode lines;
forming current conductive material within the trenches laterally adjacent to and in current conductive connection with the one of select device material or programmable material;
forming the other of the select device material or the programmable material elevationally outward of and in current conductive connection with the current conductive material; and
forming a plurality of second horizontally oriented electrode lines over and in current conductive connection with said other of the select device material or the programmable material.

21. A method of forming an array of vertically stacked tiers of nonvolatile memory cells, comprising:
forming horizontally oriented current conductive lines having longitudinally spaced masses extending vertically therefrom within individual of the tiers, the masses respectively comprising current conductive material and other material between the current conductive material and the current conductive lines, the other material being of different composition from that of the current conductive material and the current conductive lines;
forming a plurality of horizontally elongated trenches within dielectric material through the plurality of tiers and which cross the current conductive lines, the trenches exposing only one of two opposing lateral sides of the respective masses;
selectively growing one of select device material or programmable material from the current conductive material of the one lateral side of the masses; and
selectively growing current conductive material from one of the selectively grown select device material or programmable material to form a plurality of horizontally oriented electrode lines within the individual tiers, the respective selectively grown horizontally oriented electrode lines bridging horizontally between the current conductive material of adjacent of the masses.

22. A method of forming an array of vertically stacked tiers of nonvolatile memory cells, comprising:

forming horizontally oriented and laterally overlapping first, second, and third lines within individual tiers of a plurality of vertically stacked tiers; the first and third lines being current conductive and of different composition, the second lines being between the first and third lines and being of material different in composition from that of the first and third lines;

forming pairs of vertically extending and longitudinally aligned openings through the plurality of tiers on laterally opposing sides of the first, second, and third lines within the individual tiers;

laterally etching through the second and third lines selectively relative to the first lines between the respective pairs of openings to form longitudinally spaced masses which extend vertically relative to the first lines, the masses respectively comprising material of the former second and third lines;

forming a plurality of horizontally elongated trenches within dielectric material through the plurality of tiers and which cross the first lines, the trenches exposing only one of two opposing lateral sides of the respective masses;

selectively growing one of select device material or programmable material from the current conductive material of the one lateral side of the masses; and selectively growing current conductive material from the one of the selectively grown select device material or programmable material to form a plurality of horizontally oriented electrode lines within the individual tiers, the respective selectively grown horizontally oriented electrode lines bridging horizontally between the current conductive material of adjacent masses.

* * * * *